(12) United States Patent
Sada et al.

(10) Patent No.: US 12,381,548 B2
(45) Date of Patent: Aug. 5, 2025

(54) SEMICONDUCTOR DEVICE

(71) Applicant: Rohm Co., Ltd., Kyoto (JP)

(72) Inventors: Makoto Sada, Kyoto (JP); Toru Takuma, Kyoto (JP); Shuntaro Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 196 days.

(21) Appl. No.: 18/263,404

(22) PCT Filed: Nov. 29, 2021

(86) PCT No.: PCT/JP2021/043544
§ 371 (c)(1),
(2) Date: Jul. 28, 2023

(87) PCT Pub. No.: WO2022/163113
PCT Pub. Date: Aug. 4, 2022

(65) Prior Publication Data
US 2024/0088886 A1 Mar. 14, 2024

(30) Foreign Application Priority Data
Feb. 1, 2021 (JP) ................................ 2021-014497

(51) Int. Cl.
*H03K 17/0814* (2006.01)
*H10D 30/66* (2025.01)
(Continued)

(52) U.S. Cl.
CPC ..... *H03K 17/08142* (2013.01); *H10D 30/668* (2025.01); *H10D 62/127* (2025.01); *H10D 84/148* (2025.01); *H10D 84/811* (2025.01)

(58) Field of Classification Search
CPC .......... H03K 17/08142; H10D 84/148; H10D 84/811; H10D 62/127; H10D 30/668
See application file for complete search history.

(56) References Cited

U.S. PATENT DOCUMENTS

| | | | |
|---|---|---|---|
| 9,887,011 B1 * | 2/2018 | Hung | ..................... G11C 16/10 |
| 2007/0085573 A1 * | 4/2007 | Henzler | ............... H03K 17/163 |
| | | | 327/143 |

(Continued)

FOREIGN PATENT DOCUMENTS

| WO | WO 2017/187785 | 11/2017 |
|---|---|---|
| WO | WO 2020/130141 | 6/2020 |
| WO | WO 2021/024813 | 2/2021 |

OTHER PUBLICATIONS

International Search Report and Written Opinion in International Appln. No. PCT/JP2021/043544, mailed on Feb. 22, 2022, 15 pages (with machine translation).

*Primary Examiner* — Scott Bauer
(74) *Attorney, Agent, or Firm* — Fish & Richardson P.C.

(57) ABSTRACT

A semiconductor device includes: a split-gate transistor connected between a drain electrode (output electrode OUT) and a ground electrode and having a plurality of individually controllable channel regions; an active clamp circuit configured to limit the output voltage VOUT appearing at the output electrode to a clamp voltage or below; and a gate control circuit configured to raise the ON resistance of the split-gate transistor gently (or stepwise) after the split-gate transistor is switched from the ON state to the OFF state before the active clamp circuit limits the output voltage VOUT.

10 Claims, 18 Drawing Sheets

(51) Int. Cl.
*H10D 62/10* (2025.01)
*H10D 84/00* (2025.01)
*H10D 84/80* (2025.01)

(56) References Cited

U.S. PATENT DOCUMENTS

| | | |
|---|---|---|
| 2015/0162745 A1* | 6/2015 | Ikeda .................... H10D 89/60 |
| | | 361/56 |
| 2019/0123541 A1 | 4/2019 | Takuma et al. |
| 2020/0403393 A1 | 12/2020 | Takuma et al. |
| 2021/0119006 A1* | 4/2021 | Aichinger ............ H10D 64/605 |
| 2021/0143742 A1* | 5/2021 | Picard ............... H02M 3/33592 |
| 2022/0037872 A1 | 2/2022 | Takuma et al. |
| 2022/0038009 A1* | 2/2022 | Maruyama .......... H02M 1/0029 |
| 2022/0045208 A1 | 2/2022 | Okuda et al. |
| 2022/0352145 A1 | 11/2022 | Takuma et al. |

* cited by examiner

SEMICONDUCTOR DEVICE

CROSS REFERENCE OF RELATED APPLICATIONS

This application is a U.S. National Phase application under 35 U.S.C. § 371 of International Patent Application No. PCT/JP2021/043544 filed on Nov. 29, 2021, which claims the benefit of priority of Japanese Patent Application No. 2021-014497, filed on Feb. 1, 2021, the disclosure of which is incorporated herein by reference in its entirety.

TECHNICAL FIELD

The invention disclosed herein relates to semiconductor devices.

BACKGROUND ART

The applicant of the present application has been proposing a number of new technologies directed to semiconductor devices such as vehicle-onboard IPDs (intelligent power devices). See, for example, Patent Document 1 identified below.

CITATION LIST

Patent Literature

Patent Document 1: WO 2017/187785

SUMMARY OF INVENTION

Technical Problem

Inconveniently, with known semiconductor devices, it is difficult to have both a low ON resistance and a high active clamp tolerance.

In view of the above challenge encountered by the present inventors, the invention disclosed herein is aimed at providing a semiconductor device that offers a low ON resistance combined with a high active clamp tolerance.

Solution to Problem

For example, according to one aspect of what is disclosed herein, a semiconductor device includes: a split-gate transistor connected between an output electrode and a ground electrode, the split-gate transistor having a plurality of individually controllable channel regions; an active clamp circuit configured to limit the output voltage appearing at the output electrode to a clamp voltage or below; and a gate control circuit configured to raise the ON resistance of the split-gate transistor gently or stepwise after the split-gate transistor is switched from the ON state to the OFF state before the active clamp circuit limits the output voltage.

Other features, elements, steps, benefits, and characteristics will become clearer through the following description of embodiments of the invention, in conjunction with the accompanying drawings relevant to them.

Advantageous Effects of Invention

According to the invention disclosed herein, it is possible to provide a semiconductor device that offers a low ON resistance combined with a high active clamp tolerance.

DESCRIPTION OF EMBODIMENTS

<Semiconductor Device>

Various embodiments directed to semiconductor devices will be described below with reference to the accompanying drawings.

First Embodiment

Figure 1:
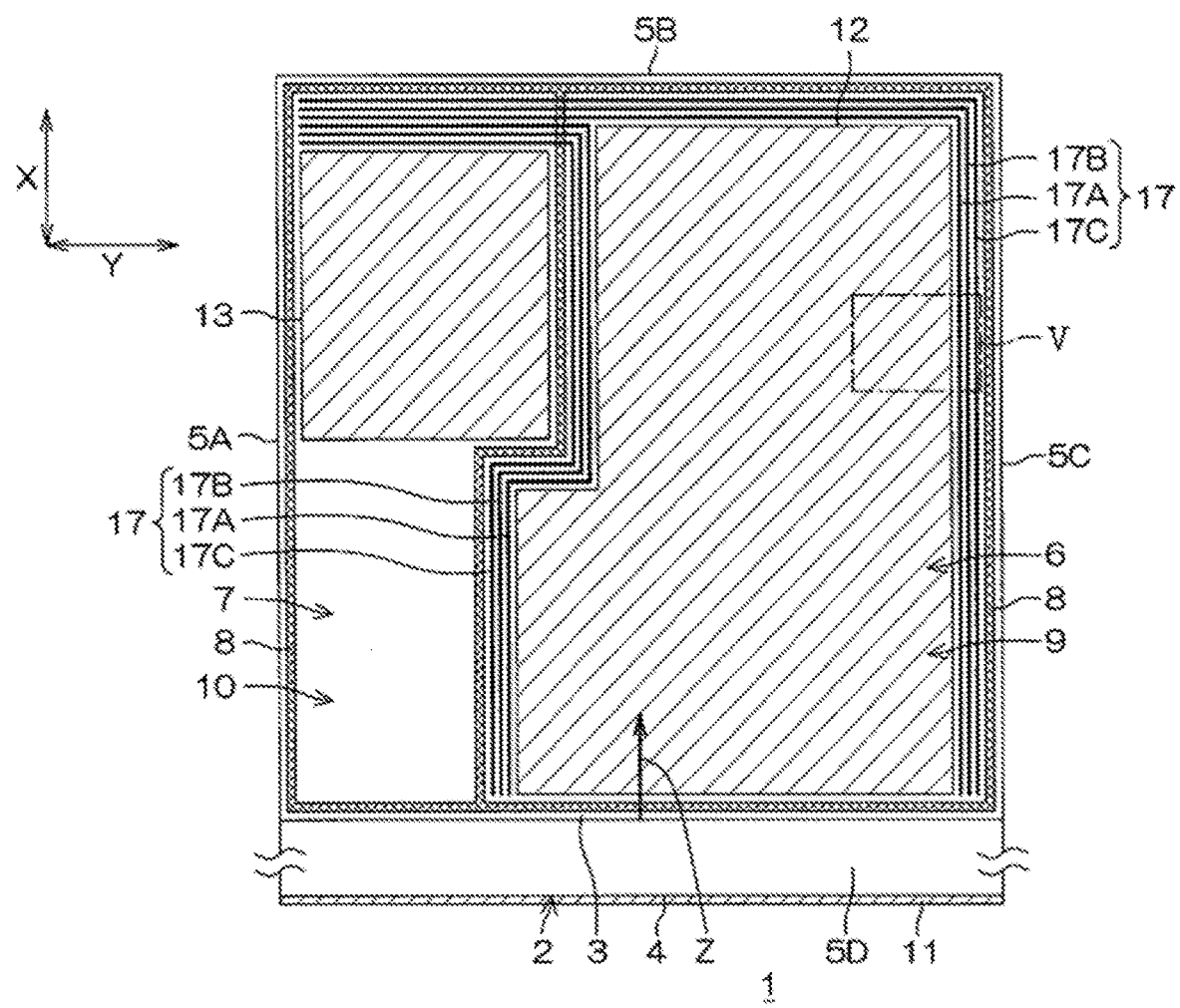
FIG. 1 is a perspective view of a semiconductor device as viewed from one direction.

FIG. 1 is a perspective view of a semiconductor device 1 as viewed from one direction. Hereinafter, a description will be given of a configuration example in which the semiconductor device 1 is a low-side switching device.

With reference to FIG. 1, the semiconductor device 1 includes a semiconductor layer 2. The semiconductor layer 2 includes silicon. The semiconductor layer 2 is formed in a rectangular parallelepiped chip shape. The semiconductor layer 2 has a first main surface 3 on one side, a second main surface 4 on the other side, and side surfaces 5A, 5B, 5C, and 5D connecting the first main surface 3 and the second main surface 4.

The first main surface 3 and the second main surface 4 are each formed in a rectangular shape in plan view when viewed from a normal direction Z thereof (hereinafter, simply referred to as "plan view"). The side surface 5A and the side surface 5C extend along a first direction X and face each other in a second direction Y which intersects the first direction X. The side surface 5B and the side surface 5D extend along the second direction Y and face each other in the first direction X. Specifically, the second direction Y is orthogonal to the first direction X.

An output region 6 and an input region 7 are defined in the semiconductor layer 2. The output region 6 is defined in a region at the side surface 5C side. The input region 7 is defined in a region at the side surface 5A side. In plan view, an area SOUT of the output region 6 is equal to or larger than an area SIN of the input region 7 (SIN≤SOUT).

A ratio SOUT/SIN of the area SOUT with respect to the area SIN may be from not less than 1 to not more than 10 (1≤SOUT/SIN≤10). The ratio SOUT/SIN may be from not less than 1 to not more than 2, from not less than 2 to not more than 4, from not less than 4 to not more than 6, from not less than 6 to not more than 8, or from not less than 8 to not more than 10. Planar shapes of the input region 7 and the output region 6 are arbitrary and not restricted to particular shapes. As a matter of course, the ratio SOUT/SIN may be in excess of 0 and less than 1.

The output region 6 includes a power MISFET (Metal Insulator Semiconductor Field Effect Transistor) 9 as an example of an insulation gate type transistor. The power MISFET 9 includes a gate, a drain, and a source.

The input region 7 includes a control IC (Integrated Circuit) 10 as an example of a control circuit. The control IC 10) includes plural types of functional circuits which realize various functions. The plural types of functional circuits include a circuit generating gate control signals which drive and control the power MISFET 9 based on an external electrical signal. The control IC 10 forms a so-called IPD (Intelligent Power Device) together with the power MISFET 9. The IPD is also referred to as an IPM (Intelligent Power Module).

The input region 7 is electrically insulated from the output region 6 by a region separation structure 8. In FIG. 1, the region separation structure 8 is indicated by hatching. Although a specific description shall be omitted, the region separation structure 8 may have a trench insulating structure in which an insulator is embedded in the trench.

On the semiconductor layer 2, a plurality of (in this embodiment, three) of electrodes 11, 12, and 13 are formed. In FIG. 1, the plurality of electrodes 11 to 13 are indicated by hatching. Each of the electrodes 11 to 13 is formed as a terminal electrode to be externally connected by a lead wire (for example, bonding wire), etc. The number, the arrangement, and the shape of the plurality of electrodes 11 to 13 are arbitrary and are not restricted to the configuration shown in FIG. 1.

The number, the arrangement, and the shape of the plurality of electrodes 11 to 13 are adjusted according to the specification of the power MISFET 9 and/or the specification of the control IC 10. In this embodiment, the plurality of electrodes 11 to 13 include a drain electrode 11 (output electrode), a source electrode 12 (reference voltage electrode), and an input electrode 13.

The drain electrode 11 is formed on the second main surface 4 of the semiconductor layer 2. The drain electrode 11 transmits the electrical signal generated by the power MISFET9 to the outside.

The drain electrode 11 may include at least any one of a Ti layer, a Ni layer, an Au layer, an Ag layer and an Al layer. The drain electrode 11 may have a single layer structure which includes a Ti layer, a Ni layer, an Au layer, an Ag layer, or an Al layer. The drain electrode 11 may have a laminated structure in which at least two of a Ti layer, a Ni layer, an Au layer, an Ag layer, and an Al layer are laminated in any given manner. The source electrode 12 is formed on the output region 6 in the first main surface 3. The source electrode 12 transmits the power supply voltage VB to the drain of the power MISFET 9 and to various circuits in the control IC 10.

The input electrode 13 is formed on the input region 7 in the first main surface 3. The input electrode 13 transmits an input voltage for driving the control IC 10.

A gate control wiring 17 as an example of a control wiring is also formed anywhere on the semiconductor layer 2, The gate control wiring 17 is selectively laid around on the output region 6 and on the input region 7. The gate control wiring 17 is electrically connected to the gate of the power MISFET 9 in the output region 6 and electrically connected to the control IC 10 in the input region 7.

The gate control wiring 17 transmits gate control signals generated by the control IC 10 to the gate of the power MISFET 9. The gate control signals include an ON signal Von and an OFF signal Voff, and control an ON state and an OFF state of the power MISFET 9.

The ON signal Von is higher than a gate threshold voltage Vth of the power MISFET 9 (Vth≤ Von). The OFF signal Voff is lower than the gate threshold voltage Vth of the power MISFET 9 (Voff<Vth). The OFF signal Voff may be the reference voltage (for example, the ground voltage).

In this embodiment, the gate control wiring 17 includes a first gate control wiring 17A, a second gate control wiring 17B, and a third gate control wiring 17C. The first gate control wiring 17A, the second gate control wiring 17B, and the third gate control wiring 17C are electrically insulated from each other.

In this embodiment, two first gate control wirings 17A are laid around in different regions. Two second gate control wirings 17B are also laid around in different regions. Further, two third gate control wirings 17C are laid around in different regions.

The first gate control wiring 17A, the second gate control wiring 17B, and the third gate control wiring 17C transmit the same gate control signal or different gate control signals to the gate of the power MISFET 9. The number, the arrangement, and the shape, etc., of the gate control wiring 17 are arbitrary and adjusted in accordance with a transmitted distance of the gate control signals and/or the number of the gate control signals to be transmitted.

The source electrode 12, the input electrode 13, and the gate control wiring 17 may each include at least any one of nickel, palladium, aluminum, copper, an aluminum alloy, and a copper alloy.

The source electrode 12, the input electrode 13, and the gate control wiring 17 may each include at least any one of an Al—Si—Cu (aluminum-silicon-copper) alloy, an Al—Si (aluminum-silicon) alloy, and an Al—Cu (aluminum-copper) alloy.

The source electrode 12, the input electrode 13, and the gate control wiring 17 may include the same type of electrode material or may include an electrode material which is different from each other.

Figure 2:
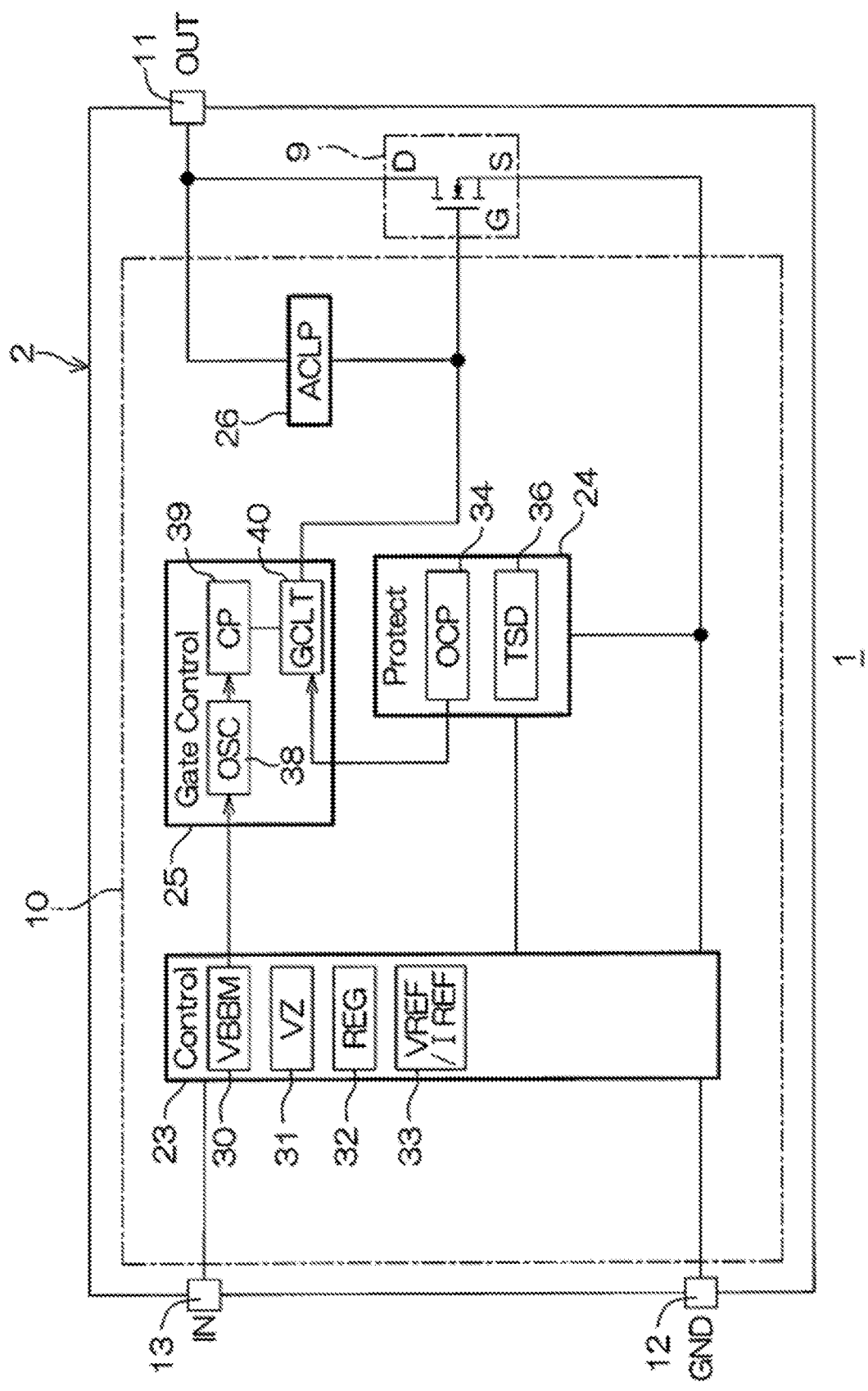
FIG. 2 is a block circuit diagram showing the electrical configuration of a semiconductor device.

FIG. 2 is a block circuit diagram which shows an electrical configuration of the semiconductor device 1 shown in FIG. 1. Hereinafter, a description will be given of an example in which the semiconductor device 1 is adopted into a vehicle.

The semiconductor device 1 includes the drain electrode 11 as an output electrode, the source electrode 12 as the reference voltage electrode, the input electrode 13, the gate control wiring 17, the power MISFET 9, and the control IC 10.

The drain electrode 11 is electrically connected to the drain of the power MISFET 9. The drain electrode 11 is connected to a load. The source electrode 12 is electrically connected to the source of the power MISFET 9. The source electrode 12 supplies the reference voltage to the power MISFET 9 and the control IC 10.

The input electrode 13 may be connected to an MCU (microcontroller unit), a DC/DC converter, a LDO (low dropout), etc. The input electrode 13 supplies an input voltage to the control IC 10. The gate of the power MISFET 9 is connected to the control IC 10) (the gate control circuit 25 to be described later) through the gate control wiring 17.

In this embodiment, the control IC 10 includes the current-voltage control circuit 23, the protection circuit 24, the gate control circuit 25, and the active clamp circuit 26.

The current-voltage control circuit 23 is connected to the source electrode 12, the input electrode 13, the protection circuit 24, and the gate control circuit 25. The current-voltage control circuit 23 generates various voltages in response to an electrical signal from the input electrode 13 and an electrical signal from the protection circuit 24. In this embodiment, the current-voltage control circuit 23 includes a driving voltage generation circuit 30, the first constant voltage generation circuit 31, the second constant voltage generation circuit 32, and the reference voltage-reference current generation circuit 33.

The driving voltage generation circuit 30 generates the driving voltage for driving the gate control circuit 25. The driving voltage generated by the driving voltage generation circuit 30 is input to the gate control circuit 25.

The first constant voltage generation circuit 31 generates a first constant voltage for driving the protection circuit 24. The first constant voltage generation circuit 31 may include a Zener diode and/or a regulator circuit. The first constant voltage may be 1 V or more but 5 V or less. The first constant voltage is input to the protection circuit 24 (for example, the overcurrent protection circuit 34).

The second constant voltage generation circuit 32 generates a second constant voltage for driving the protection circuit 24. The second constant voltage generation circuit 32 may include a Zener diode and/or a regulator circuit. The second constant voltage may be 1 V or more but 5 V or less. The second constant voltage is input to the protection circuit 24 (for example, the overheat protection circuit 36).

The reference voltage-reference current generation circuit 33 generates a reference voltage and a reference current for various types of circuits. The reference voltage may be 1 V or more but 5 V or less. The reference current may be 1 mA or more but 1 A or less. The reference voltage and the reference current are input to various types of circuits. In a case where the various types of circuits include the comparator, the reference voltage and the reference current may be input to the comparator.

The protection circuit 24 is connected to the current-voltage control circuit 23, the gate control circuit 25, and the source of the power MISFET 9. The protection circuit 24 includes the overcurrent protection circuit 34 and the overheat protection circuit 36.

The overcurrent protection circuit 34 protects the power MISFET 9 from an overcurrent. The overcurrent protection circuit 34 is connected to the gate control circuit 25. The overcurrent protection circuit 34 may include the current monitor circuit. A signal generated by the overcurrent protection circuit 34 is input to the gate control circuit 25 (specifically, the driving signal output circuit 40 to be described later).

The overheat protection circuit 36 protects the power MISFET 9 from an excessive temperature rise. The overheat protection circuit 36 is connected to the current-voltage control circuit 23. The overheat protection circuit 36 monitors a temperature of the semiconductor device 1. The overheat protection circuit 36 may include a temperature sensitive device such as a diode and a thermistor. A signal generated by the overheat protection circuit 36 is input to the current-voltage control circuit 23.

The gate control circuit 25 controls the ON state and the OFF state of the power MISFET 9. The gate control circuit 25 is connected to the current-voltage control circuit 23, the protection circuit 24, and the gate of the power MISFET 9.

The gate control circuit 25 generates plural types of gate control signals according to the number of the gate control wirings 17 in response to an electrical signal from the current-voltage control circuit 23 and an electrical signal from the protection circuit 24. The plural types of gate control signals are input to the gate of the power MISFET 9 through the gate control wiring 17.

Specifically, the gate control circuit 25 has the functions of turning on and off the power MISFET 9 by collectively controlling a plurality of gate control signals according to the electrical signal (input signal) applied to the input electrode 13 and of, during the operation of the active clamp circuit 26, individually controlling the plurality of gate control signals so as to increase the ON resistance of the power MISFET 9 (this will be described in detail later).

Specifically, the gate control circuit 25 includes the oscillation circuit 38, the charge pump circuit 39, and the driving signal output circuit 40. The oscillation circuit 38 oscillates in response to an electrical signal from the current-voltage control circuit 23 to generate a predetermined electrical signal. The electrical signal generated by the oscillation circuit 38 is input to the charge pump circuit 39. The charge pump circuit 39 boosts the electrical signal from the oscillation circuit 38. The electrical signal boosted by the charge pump circuit 39 is input to the driving signal output circuit 40).

The driving signal output circuit 40 generates plural types of gate control signals in response to an electrical signal from the charge pump circuit 39 and an electrical signal from the protection circuit 24 (specifically, the overcurrent protection circuit 34). The plural types of gate control signals are input to the gate of the power MISFET 9 through the gate control wiring 17. Thereby, the power MISFET 9 is driven and controlled.

The active clamp circuit 26 protects the power MISFET 9 from the counter electromotive force. The active clamp circuit 26 is connected to the drain electrode 11 and the gate of the power MISFET 9. The active clamp circuit 26 may include a plurality of diodes.

The active clamp circuit 26 may include a plurality of diodes which are connected to each other in a forward-biased manner. The active clamp circuit 26 may include a plurality of diodes which are connected to each other in a reverse-biased manner. The active clamp circuit 26 may include a plurality of diodes which are connected to each other in a forward-biased manner and a plurality of diodes which are connected to each other in a reverse-biased manner.

The plurality of diodes may include a pn junction diode or a Zener diode, or a pn junction diode and a Zener diode. The active clamp circuit 26 may include a plurality of Zener diodes which are connected to each other in a biased manner. The active clamp circuit 26 may include a Zener diode and a pn junction diode which are connected to each other in a reverse-biased manner.

Figure 3:
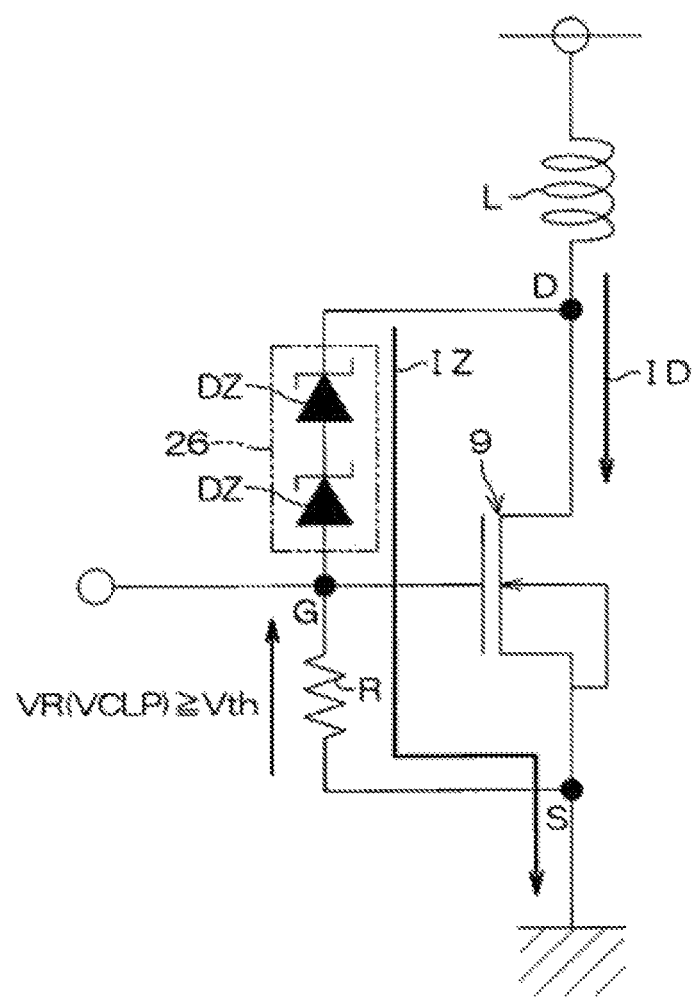
FIG. 3 is a circuit diagram illustrating normal operation and active clamp operation of a semiconductor device.
Figure 4:
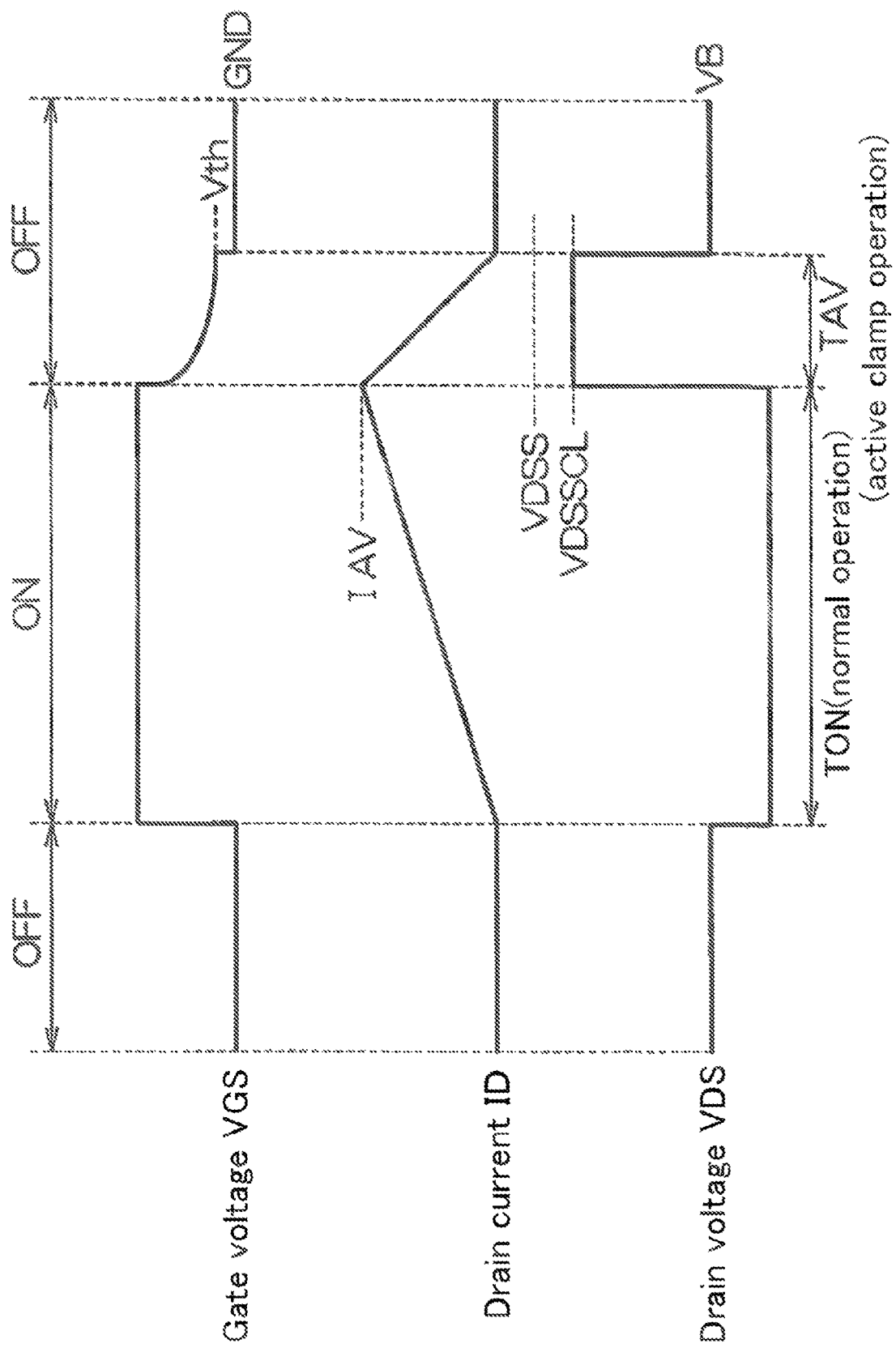
FIG. 4 is a waveform diagram of relevant electrical signals.

FIG. 3 is a circuit diagram for describing the normal operation and the active clamp operation of the semiconductor device 1 shown in FIG. 1. FIG. 4 is a waveform chart of a main electrical signal applied to the circuit diagram shown in FIG. 3.

Here, a circuit example in which the inductive load L is connected to the power MISFET 9 is used to describe the normal operation and the active clamp operation of the semiconductor device 1. A device which uses a solenoid, a motor, a transformer, and a winding (coil) such as a relay, etc., is shown as an example of the inductive load L. The inductive load L is also called the L load.

With reference to FIG. 3, the source of the power MISFET 9 is connected to the ground. The drain of the power MISFET 9 is electrically connected to the inductive load L. The gate and the drain of the power MISFET 9 are connected to the active clamp circuit 26. The gate and the source of the power MISFET 9 are connected to a resistance R. In this circuit example, the active clamp circuit 26 includes the k number (k is a natural number) of Zener diodes DZ which are connected to each other in a biased manner.

With reference to FIG. 3 and FIG. 4, when the ON signal Von is input to the gate of the power MISFET 9 in the OFF state, the power MISFET 9 is switched from the OFF state to the ON state (the normal operation). The ON signal Von has a voltage equal to or larger than the gate threshold voltage Vth (Vth≤Von). The power MISFET 9 is kept in the ON state only for a predetermined ON time TON.

When the power MISFET 9 is switched to the ON state, a drain current ID starts to flow from the drain of the power MISFET 9 to the source thereof. The drain current ID is increased proportionally in accordance with the ON time TON of the power MISFET 9. The inductive load L allows an inductive energy to accumulate due to an increase in the drain current ID.

When the OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (for example, the ground voltage). When the power MISFET 9 is switched to the OFF state, an inductive energy of the inductive load L is applied to the power MISFET 9 as the counter electromotive force.

Thereby, the power MISFET 9 is shifted to the active clamp state (the active clamp operation). When the power MISFET 9 is shifted to the active clamp state, a drain voltage VDS is sharply raised to a clamp voltage VDSSCL.

In a case where the clamp voltage VDSSCL exceeds a maximum rated drain voltage VDSS (VDSS<VDSSCL), the power MISFET 9 reaches breakdown. The power MISFET 9 is designed such that the clamp voltage VDSSCL becomes equal to or less than the maximum rated drain voltage VDSS (VDSSCL≤VDSS).

In a case where the clamp voltage VDSSCL is equal to or less than the maximum rated drain voltage VDSS (VDSSCL≤VDSS), a reverse current IZ flows to the active clamp circuit 26. Thereby, a limit voltage VL is formed between terminals of the active clamp circuit 26. In this embodiment, the limit voltage VL is a sum of voltages across terminals VZ of Zener diodes DZ in the active clamp circuit 26 (VL=k·VZ).

Further, the reverse current IZ passes through the resistance R and reaches a ground. Thereby, a voltage VR between terminals is formed between terminals of the resistance R. The voltage VR between terminals of the resistance R (=IZ×R) is adjusted to a voltage not less than the gate threshold voltage Vth (Vth≤VR). The voltage VR between terminals is applied between the gate and the source of the power MISFET 9 as the clamp ON voltage VCLP. Therefore, the power MISFET 9 keeps the ON state in the active clamp state. The clamp ON voltage VCLP (voltage VR between terminals) may have a voltage less than the ON signal Von.

Thereby, the inductive energy of the inductive load L is consumed (absorbed) in the power MISFET 9. After an active clamp time TAV, the drain current ID is reduced to zero from a peak value IAV which is immediately before the power MISFET 9 becomes the OFF state. Thereby, the gate voltage VGS becomes the ground voltage and the drain voltage VDS becomes the power supply voltage VB, and the power MISFET 9 is switched from the ON state to the OFF state.

The active clamp capability (active clamp tolerance) Eac of the power MISFET 9 is defined by the capability in the active clamp operation. More specifically, the active clamp capability Eac is defined by the capability with respect to the counter electromotive force caused by an inductive energy of the inductive load L in transition when the power MISFET 9 is switched from the ON state to the OFF state.

More specifically, the active clamp capability Eac is defined by a capability with respect to an energy caused by the clamp voltage VDSSCL, as apparent from the circuit example of FIG. 3.

The ON resistance and the active clamp tolerance are adjusted, for example, through adjustment of the channel area of the transistor. Increasing the channel area results in increasing the current passage in the normal operation and hence reducing the ON resistance. This, however, leads to a reduced active clamp tolerance as a result of a sharp rise in temperature ascribable to a counter-electromotive force in the active clamp operation.

Conversely, decreasing the channel area results in reducing the current passage in the normal operation and hence increasing the ON resistance. This, however, helps suppress a sharp rise in temperature ascribable to a counter-electromotive force in the active clamp operation and thus helps improve the active clamp tolerance. Thus, adjustment relying on the channel area suffers from a tradeoff, and this makes it difficult to have a low ON resistance combined with a high active clamp tolerance.

Below will be presented a novel structure of a power MISFET that is free from a tradeoff as mentioned above.

<Power MISFET (Split-Gate Type)

Figure 5:
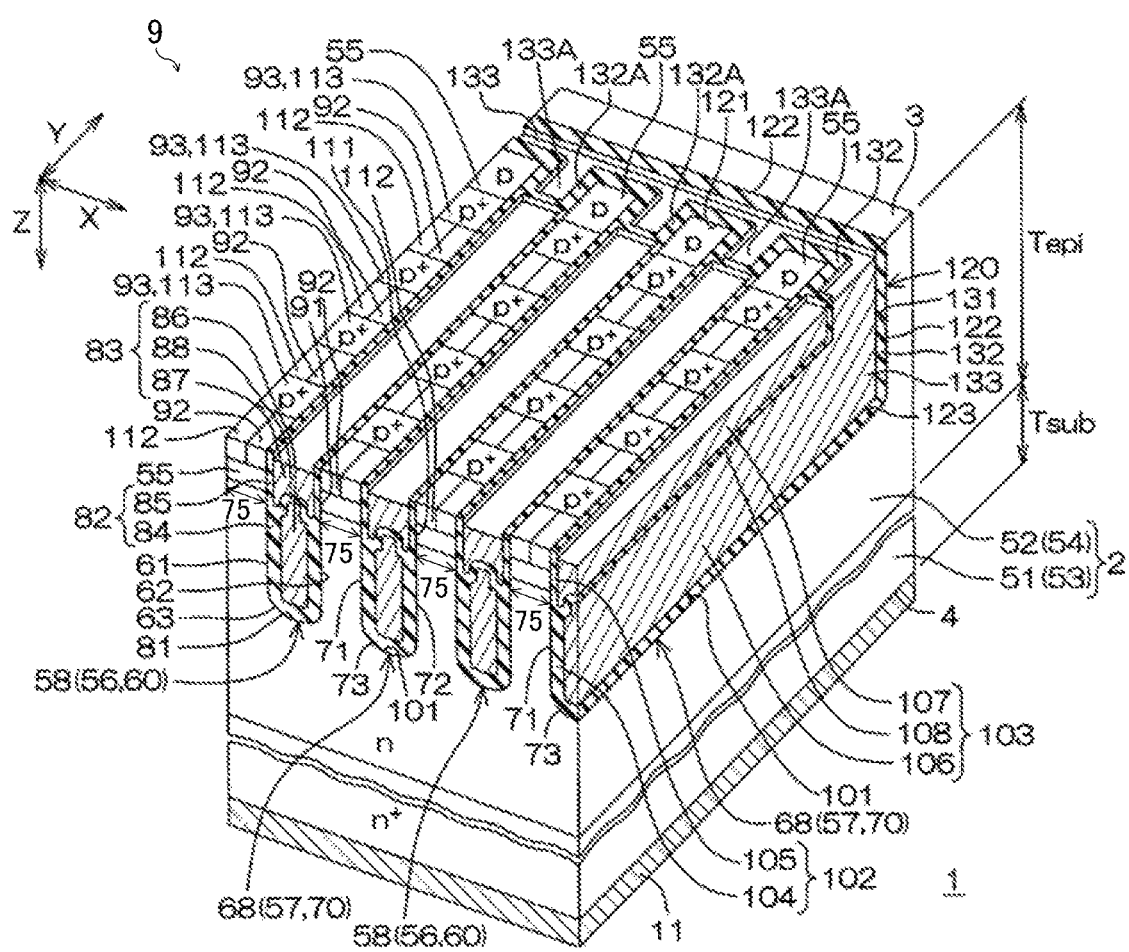
FIG. 5 is a sectional perspective view of region V in FIG. 1.

FIG. 5 is a sectional perspective view of a region V shown in FIG. 1. In the diagram, for convenience' sake, the upper structure of the first main surface 3 (such as the source electrode 12, the gate control wiring 17, and the interlayer insulation layer) are omitted from illustration.

In the semiconductor device 1 shown in FIG. 5, in this embodiment, the semiconductor layer 2 has a laminated structure including an nt-type semiconductor substrate 51 and an n-type epitaxial layer 52. The second main surface 4 of the semiconductor layer 2 is formed by the semiconductor substrate 51. The first main surface 3 of the semiconductor layer 2 is formed by the epitaxial layer 52. The side surfaces 5A to 5D of the semiconductor layer 2 are formed by the semiconductor substrate 51 and the epitaxial layer 52.

The epitaxial layer 52 has an n-type impurity concentration less than an n-type impurity concentration of the semiconductor substrate 51. The n-type impurity concentration of the semiconductor substrate 51 may be from not less than $1\times10^{18}$ cm$^{-3}$ to not more than $1\times10^{20}$ cm$^{-3}$. The n-type impurity concentration of the epitaxial layer 52 may be from not less than $1\times100^{15}$ cm$^{-3}$ to not more than $1\times10^{8}$ cm$^{-3}$.

The epitaxial layer 52 has a thickness Tepi less than a thickness Tsub of the semiconductor substrate 51 (Tepi<Tsub). The thickness Tsub may be from not less than 50 µm to not more than 450 µm. The thickness Tsub may be from not less than 50 µm to not more than 150 µm, from not less than 150 µm to not more than 250 µm, from not less than 250 µm to not more than 350 µm, or from not less than 350 µm to not more than 450 µm.

By reducing the thickness Tsub, it becomes possible to reduce a resistance value. The thickness Tsub is adjusted by grinding. In this case, the second main surface 4 of the semiconductor layer 2 may be a ground surface having a grinding mark.

The thickness Tepi of the epitaxial layer 52 is preferably not more than 1/10 of the thickness Tsub. The thickness Tepi may be from not less than 5 µm to not more than 20 µm. The thickness Tepi may be from not less than 5 µm to not more than 10 µm, from not less than 10 µm to not more than 15 µm, or from not less than 15 µm to not more than 20 µm. The thickness Tepi is preferably from not less than 5 µm to not more than 15 µm.

The semiconductor substrate 51 is formed in the second main surface 4 side of the semiconductor layer 2 as a drain region 53. The epitaxial layer 52 is formed in a surface layer portion of the first main surface 3 of the semiconductor layer 2 as a drift region 54 (drain drift region). A bottom portion of the drift region 54 is formed by a boundary between the semiconductor substrate 51 and the epitaxial layer 52. Hereinafter, the epitaxial layer 52 is referred to as the drift region 54.

A p-type body region 55 is formed in a surface layer portion of the first main surface 3 of the semiconductor layer 2 in the output region 6. The body region 55 is a region which serves as a base of the power MISFET 9. A p-type impurity concentration of the body region 55 may be from not less than $1\times10^{15}$ cm$^{-3}$ to not more than $1\times10^{18}$ cm$^{31\ 3}$.

The body region 55 is formed in a surface layer portion of the drift region 54. A bottom portion of the body region 55 is formed in a region in the first main surface 3 side with respect to the bottom portion of the drift region 54. A thickness of the body region 55 may be from not less than 0.5 µm to not more than 2 µm. The thickness of the body region 55 may be from not less than 0.5 µm to not more than 1 µm, from not less than 1 µm to not more than 1.5 µm, or from not less than 1.5 µm to not more than 2 µm.

The power MISFET 9 includes a first MISFET 56 (first transistor) and a second MISFET 57 (second transistor). The first MISFET 56 is electrically separated from the second MISFET 57 and controlled independently. The second MISFET 57 is electrically separated from the first MISFET 56 and controlled independently.

That is, the power MISFET 9 is configured such as to be driven when the first MISFET 56 and the second MISFET 57 are both in ON states (Full-ON control). The power MISFET 9 is also configured such as to be driven when the first MISFET 56 is in an ON state while the second MISFET 57 is in an OFF state (first Half-ON control). Further, the power MISFET 9 is configured such as to be driven when the first MISFET 56 is in an OFF state while the second MISFET 57 is in an ON state (second Half-ON control).

In the case of Full-ON control, the power MISFET 9 is driven in a state where all current paths are opened. Therefore, an ON resistance inside the semiconductor layer 2 is relatively reduced. On the other hand, in the case of first Half-ON control or second Half-ON control, the power MISFET 9 is driven in a state where some of the current paths are blocked. Therefore, the ON resistance inside the semiconductor layer 2 is relatively increased.

Specifically, the first MISFET 56 includes a plurality of first FET (Field Effect Transistor) structures 58. The plurality of first FET structures 58 are arrayed at intervals along the first direction X, and extend in a band shape along the second direction Y, respectively, in plan view. The plurality of first FET structures 58 are formed in a stripe shape as a whole in plan view.

In FIG. 5, a region of the first FET structure 58 at one end portion side is shown, while a region of the first FET structure 58 at the other end portion side is omitted. The region of the first FET structure 58 at the other end portion side is substantially similar in structure to the region of the first FET structure 58 at one end portion side. Hereinafter, the structure of the region of the first FET structure 58 at one end portion side is described as an example, and a description of the structure of the region of the first FET structure 58 at the other end portion side shall be omitted.

In this embodiment, each of the first FET structures 58 includes a first trench gate structure 60. A first width WT1 of the first trench gate structure 60 may be from not less than 0.5 µm to not more than 5 µm. The first width WT1 is a width in a direction (first direction X) orthogonal to a direction (second direction Y) in which the first trench gate structure 60 extends.

The first width WT1 may be from not less than 0.5 µm to not more than 1 µm, from not less than 1 µm to not more than 1.5 µm, from not less than 1.5 µm to not more than 2 µm, from not less than 2 µm to not more than 2.5 µm, from not less than 2.5 µm to not more than 3 µm, from not less than 3 µm to not more than 3.5 µm, from not less than 3.5 µm to not more than 4 µm, from not less than 4 µm to not more than 4.5 µm, or from not less than 4.5 µm to not more than 5 µm. The first width WT1 is preferably from not less than 0.8 µm to not more than 1.2 µm.

The first trench gate structure 60 penetrates through the body region SS and reaches the drift region 54. A first depth DT1 of the first trench gate structure 60 may be from not less than 1 µm to not more than 10 µm. The first depth DT1 may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The first depth DT1 is preferably from not less than 2 µm to not more than 6 µm.

The first trench gate structure 60 includes a first side wall 61 on one side, a second side wall 62 on the other side, and a bottom wall 63 which connects the first side wall 61 and the second side wall 62. Hereinafter, the first side wall 61, the second side wall 62, and the bottom wall 63 may be collectively referred to as "an inner wall" or "an outer wall."

An absolute value of an angle (taper angel) formed between the first side wall 61 and the first main surface 3 inside the semiconductor layer 2 may be in excess of 90° and not more than 95° (for example, approximately 91°). The absolute value of an angle (taper angel) formed between the second side wall 62 and the first main surface 3 inside the semiconductor layer 2 may be in excess of 90° and not more than 95° (for example, approximately 91°). The first trench gate structure 60 may be formed in a shape (tapered shape)

that the first width WT1 is made narrow from the first main surface 3 side to the bottom wall 63 side in sectional view.

The bottom wall 63 of the first trench gate structure 60 is positioned in a region at the first main surface 3 side with respect to the bottom portion of the drift region 54. The bottom wall 63 of the first trench gate structure 60 is formed in a convex curved shape (U letter shape) toward the bottom portion of the drift region 54.

The bottom wall 63 of the first trench gate structure 60 is positioned in a region at the first main surface 3 side with a first interval IT1 of not less than 1 μm to not more than 10 μm from the bottom portion of the drift region 54. The first interval IT1 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The first interval IT1 is preferably from not less than 1 μm to not more than 5 μm.

In this embodiment, the second MISFET 57 includes a plurality of second FET structures 68. The plurality of second FET structures 68 are arrayed at intervals along the first direction X, and extend in a band shape along the second direction Y, respectively, in plan view.

The plurality of second FET structures 68 extend along the same direction as the plurality of first FET structures 58. The plurality of second FET structures 68 are formed in a stripe shape as a whole in plan view. In this embodiment, the plurality of second FET structures 68 are arrayed alternately with the plurality of first FET structures 58 in a manner that one first FET structure 58 is held therebetween.

In FIG. 5, a region of the second FET structure 68 at one end portion side is shown in the drawing, while a region of the second FET structure 68 at the other end portion side is omitted. The region of the second FET structure 68 at the other end portion side is substantially similar in structure to the region of the second FET structure 68 t one end portion side. Hereinafter, the structure of the region of the second FET structure 68 at one end portion side is described as an example, and a description of the structure of the region of the second FET structure 68 at the other end portion side shall be omitted.

In this embodiment, each of the second FET structures 68 includes a second trench gate structure 70. A second width WT2 of the second trench gate structure 70 may be from not less than 0.5 μm to not more than 5 μm. The second width WT2 is a width in a direction (first direction X) orthogonal to a direction (second direction Y) in which the second trench gate structure 70 extends.

The second width WT2 may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 μm, or from not less than 4.5 μm to not more than 5 μm. The second width WT2 is preferably from not less than 0.8 μm to not more than 1.2 μm.

The second width WT2 of the second trench gate structure 70 may be equal to or more than the first width WT1 of the first trench gate structure 60 (WT≤WT2). The second width WT2 may be equal to or less than the first width WT1 (WT1≥WT2). It is preferable that the second width WT2 is equal to the first width WT1 (WT1=WT2).

The second trench gate structure 70 penetrates through the body region 55 and reaches the drift region 54. A second depth DT2 of the second trench gate structure 70 may be from not less than 1 μm to not more than 10 μm. The second depth DT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second depth DT2 is preferably from not less than 2 μm to not more than 6 μm.

The second depth DT2 of the second trench gate structure 70 may be equal to or more than the first depth DT1 of the first trench gate structure 60 (DT1≤DT2). The second depth DT2 may be equal to or less than the first depth DT1 (DT1≥DT2). It is preferable that the second depth DT2 is equal to the first depth DT1 (DT1=DT2).

The second trench gate structure 70 includes a first side wall 71 on one side, a second side wall 72 on the other side, and a bottom wall 73 which connects the first side wall 71 and the second side wall 72. Hereinafter, the first side wall 71, the second side wall 72, and the bottom wall 73 may be collectively referred to as "an inner wall" or "an outer wall."

An absolute value of an angle (taper angel) formed between the first side wall 71 and the first main surface 3 inside the semiconductor layer 2 may be in excess of 90° and not more than 95° (for example, approximately 91°). The absolute value of an angle (taper angel) formed between the second side wall 72 and the first main surface 3 inside the semiconductor layer 2 may be in excess of 90° and not more than 95° (for example, approximately 91°). The second trench gate structure 70 may be formed in a shape (tapered shape) that the second width WT2 is made narrow from the first main surface 3 side to the bottom wall 73 side in sectional view.

The bottom wall 73 of the second trench gate structure 70 is positioned in a region at the first main surface 3 side with respect to the bottom portion of the drift region 54. The bottom wall 73 of the second trench gate structure 70 is formed in a convex curved shape (U letter shape) toward the bottom portion of the drift region 54.

The bottom wall 73 of the second trench gate structure 70 is positioned in a region at the first main surface 3 side with a second interval IT2 of not less than 1 μm to not more than 10 μm from the bottom portion of the drift region 54. The second interval IT2 may be from not less than 1 μm to not more than 2 μm, from not less than 2 μm to not more than 4 μm, from not less than 4 μm to not more than 6 μm, from not less than 6 μm to not more than 8 μm, or from not less than 8 μm to not more than 10 μm. The second interval IT2 is preferably from not less than 1 μm to not more than 5 μm.

Cell regions 75 are each defined in regions between the plurality of first trench gate structures 60) and the plurality of second trench gate structures 70. The plurality of cell regions 75 are arrayed at intervals along the first direction X, and extend in a band shape along the second direction Y, respectively, in plan view. The plurality of cell regions 75 extend along the same direction as the first trench gate structure 60 and the second trench gate structure 70. The plurality of cell regions 75 are formed in a stripe shape as a whole in plan view.

A first depletion layer spreads inside the drift region 54 from an outer wall of the first trench gate structure 60. The first depletion layer spreads toward a direction along the first main surface 3 from the outer wall of the first trench gate structure 60 and toward the normal direction Z. Similarly, a second depletion layer spreads inside the drift region 54 from the outer wall of the second trench gate structure 70. The second depletion layer spreads toward a direction along the first main surface 3 from the outer wall of the second trench gate structure 70 and toward the normal direction Z.

The second trench gate structure 70 is arrayed at an interval from the first trench gate structure 60 in a manner that the second depletion layer overlaps with the first depletion layer. That is, the second depletion layer overlaps with the first depletion layer in a region at the first main surface 3 side with respect to the bottom wall 73 of the second trench gate structure 70 in the cell region 75, According to the above described structure, since it is possible to suppress an electric field concentration on the first trench gate structure 60 and the second trench gate structure 70, it is possible to suppress a reduction in breakdown voltage.

It is preferable that the second depletion layer overlaps with the first depletion layer in a region at the bottom portion side of the drift region 54 with respect to the bottom wall 73 of the second trench gate structure 70. According to the above described structure, since it is possible to suppress an electric field concentration in the bottom wall 63 of the first trench gate structure 60 and the bottom wall 73 of the second trench gate structure 70, it is possible to appropriately suppress a reduction in breakdown voltage.

A pitch PS between a side wall of the first trench gate structure 60 and that of the second trench gate structure 70 may be from not less than 0.2 μm to not more than 2 μm. The pitch PS is a distance in a direction (first direction X) orthogonal to a direction (second direction Y) in which the first trench gate structure 60 and the second trench gate structure 70 extend between the first side wall 61 (second side wall 62) of the first trench gate structure 60 and the second side wall 72 (first side wall 71) of the second trench gate structure 70.

The pitch PS may be from not less than 0.2 μm to not more than 0.4 μm, from not less than 0.4 μm to not more than 0.6 μm, from not less than 0.6 μm to not more than 0.8 μm, from not less than 0.8 μm to not more than 1.0 μm, from not less than 1.0 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2.0 μm. The pitch PS is preferably from not less than 0.3 μm to not more than 1.5 μm.

A pitch PC between a central portion of the first trench gate structure 60 and that of the second trench gate structure 70 may be from not less than 1 μm to not more than 7 μm. The pitch PC is a distance in a direction (the first direction X) orthogonal to a direction (the second direction Y) in which the first trench gate structure 60 and the second trench gate structure 70 extend between the central portion of the first trench gate structure 60 and the central portion of the second trench gate structure 70.

The pitch PC may be from not less than 1 μm to not more than 2 μm, from not less than 2 μm to not more than 3 μm, from not less than 3 μm to not more than 4 μm, from not less than 4 μm to not more than 5 μm, from not less than 5 μm to not more than 6 μm, or from not less than 6 μm to not more than 7 μm. The pitch PC is preferably from not less than 1 μm to not more than 3 μm.

More specifically, the first trench gate structure 60 includes a first gate trench 81, a first insulation layer 82, and a first electrode 83. The first gate trench 81 is formed by digging down the first main surface 3 toward the second main surface 4 side.

The first gate trench 81 defines the first side wall 61, the second side wall 62, and the bottom wall 63 of the first trench gate structure 60. Hereinafter, the first side wall 61, the second side wall 62, and the bottom wall 63 of the first trench gate structure 60 shall also be referred to as the first side wall 61, the second side wall 62, and the bottom wall 63 of the first gate trench 81.

The first insulation layer 82 is formed in a film shape along an inner wall of the first gate trench 81. The first insulation layer 82 defines a concave space inside the first gate trench 81. A portion which covers the bottom wall 63 of the first gate trench 81 in the first insulation layer 82 is conformally formed along the bottom wall 63 of the first gate trench 81. Thereby, the first insulation layer 82 defines a U letter space which is recessed in a U letter shape inside the first gate trench 81.

The first insulation layer 82 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The first insulation layer 82 may have a laminated structure including an SiN layer and an $SiO_2$ layer formed in that order from the semiconductor layer 2 side. The first insulation layer 82 may have a laminated structure including an $SiO_2$ layer and an SiN layer formed in that order from the semiconductor layer 2 side. The first insulation layer 82 has a single layer structure composed of an $SiO_2$ layer or an SiN layer. In this embodiment, the first insulation layer 82 has a single layer structure composed of an $SiO_2$ layer.

The first insulation layer 82 includes a first bottom-side insulation layer 84 and a first opening-side insulation layer 85 which are formed in this order from the bottom wall 63 side of the first gate trench 81 to the first main surface 3 side.

The first bottom-side insulation layer 84 covers the inner wall of the first gate trench 81 at the bottom wall 63 side. More specifically, the first bottom-side insulation layer 84 covers the inner wall of the first gate trench 81 at the bottom wall 63 side with respect to the bottom portion of the body region 55. The first bottom-side insulation layer 84 defines a U letter space at the bottom wall 63 side of the first gate trench 81. The first bottom-side insulation layer 84 has a smooth inner wall surface which defines the U letter space. The first bottom-side insulation layer 84 is in contact with the drift region 54. A part of the first bottom-side insulation layer 84 may be in contact with the body region 55.

The first opening-side insulation layer 85 covers the inner wall of the first gate trench 81 at the opening side. More specifically, the first opening-side insulation layer 85 covers the first side wall 61 and the second side wall 62 of the first gate trench 81 in a region at the opening side of the first gate trench 81 with respect to the bottom portion of the body region 55. The first opening-side insulation layer 85 is in contact with the body region 55. A part of the first opening-side insulation layer 85 may be in contact with the drift region 54.

The first bottom-side insulation layer 84 has a first thickness T1. The first opening-side insulation layer 85 has a second thickness T2 less than the first thickness T1 (T2<T1). The first thickness T1 is a thickness of the first bottom-side insulation layer 84 along a normal direction of the inner wall of the first gate trench 81. The second thickness T2 is a thickness of the first opening-side insulation layer 85 along the normal direction of the inner wall of the first gate trench 81.

A first ratio T1/WT1 of the first thickness T1 with respect to the first width WT1 of the first gate trench 81 may be from not less than 0.1 to not more than 0.4. Instead, the first ratio T1/WT1 may be from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The first ratio T1/WT1 is preferably from not less than 0.25 to not more than 0.35.

The first thickness T1 of the first bottom-side insulation layer 84 may be from not less than 1500 Å to not more than 4000 Å. The first thickness T1 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The first thickness T1 is preferably from not less than 1800 Å to not more than 3500 Å.

The first thickness T1 may be adjusted to a range from not less than 4000 Å to not more than 12000 Å according to the first width WT1 of the first gate trench 81. The first thickness T1 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the first bottom-side insulation layer 84, it becomes possible to increase a withstand voltage of the semiconductor device 1.

The second thickness T2 of the first opening-side insulation layer 85 may be from not less than 1/100 to not more than 1/10 of the first thickness T1 of the first bottom-side insulation layer 84. The second thickness T2 may be from not less than 100 Å to not more than 500 Å. The second thickness T2 may be from not less than 100 Å to not more than 200 Å, from not less than 200 Å to not more than 300 Å, from not less than 300 Å to not more than 400 Å, or from not less than 400 Å to not more than 500 Å. The second thickness T2 is preferably from not less than 200 Å to not more than 400 Å.

The first bottom-side insulation layer 84 is formed in a manner that the first thickness T1 is reduced from a part which covers the first side wall 61 and the second side wall 62 of the first gate trench 81 toward a part which covers the bottom wall 63 of the first gate trench 81.

The part which covers the bottom wall 63 of the first gate trench 81 in the first bottom-side insulation layer 84 is smaller in thickness than the part which covers the first side wall 61 and the second side wall 62 of the first gate trench 81 in the first bottom-side insulation layer 84. An opening width of the U letter space in the bottom wall side defined by the first bottom-side insulation layer 84 is expanded by an amount of a reduction in the first thickness T1. Thereby, the U letter space is suppressed from being tapered. The above-described U letter space is formed, for example, by an etching method (for example, a wet etching method) to the inner wall of the first bottom-side insulation layer 84.

The first electrode 83 is embedded in the first gate trench 81 across the first insulation layer 82. First gate control signals (first control signals) including an ON signal Von and an OFF signal Voff are applied to the first electrode 83. In this embodiment, the first electrode 83 has an insulated separation type split electrode structure including a first bottom-side electrode 86, a first opening-side electrode 87, and a first intermediate insulation layer 88.

The first bottom-side electrode 86 is embedded in the bottom wall 63 side of the first gate trench 81 across the first insulation layer 82. More specifically, the first bottom-side electrode 86 is embedded in the bottom wall 63 side of the first gate trench 81 across the first bottom-side insulation layer 84. The first bottom-side electrode 86 faces the drift region 54 across the first bottom-side insulation layer 84. A part of the first bottom-side electrode 86 may face the body region 55 across the first bottom-side insulation layer 84.

The first bottom-side electrode 86 defines an inverted concave recess in sectional view between the first bottom-side insulation layer 84 and the first opening-side insulation layer 85 at the opening side of the first gate trench 81. According to the above-described structure, since it is possible to suppress a local electric field concentration on the first bottom-side electrode 86, it is possible to suppress a reduction in breakdown voltage. In particular, by embedding the first bottom-side electrode 86 into an expanded U letter space of the first bottom-side insulation layer 84, it becomes possible to appropriately suppress the first bottom-side electrode 86 from being tapered from the upper end portion to the lower end portion. Thereby, it is possible to appropriately suppress a local electric field concentration on the lower end portion of the first bottom-side electrode 86.

The first bottom-side electrode 86 may include at least any one of conductive polysilicon, tungsten, aluminum, copper, an aluminum alloy, and a copper alloy. In this embodiment, the first bottom-side electrode 86 includes conductive polysilicon. The conductive polysilicon may include an n-type impurity or a p-type impurity. The conductive polysilicon preferably includes an n-type impurity.

The first opening-side electrode 87 is embedded into the opening side of the first gate trench 81 across the first insulation layer 82. More specifically, the first opening-side electrode 87 is embedded in the inverted concave recess defined at the opening side of the first gate trench 81 across the first opening-side insulation layer 85. The first opening-side electrode 87 faces the body region 55 across the first opening-side insulation layer 85. A part of the first opening-side electrode 87 may face the drift region 54 across the first opening-side insulation layer 85.

The first opening-side electrode 87 may include at least any one of conductive polysilicon, tungsten, aluminum, copper, an aluminum alloy, and a copper alloy. The first opening-side electrode 87 preferably includes the same type of conductive material as the first bottom-side electrode 86. In this embodiment, the first opening-side electrode 87 includes conductive polysilicon. The conductive polysilicon may include an n-type impurity or a p-type impurity. The conductive polysilicon preferably includes an n-type impurity.

The first intermediate insulation layer 88 is interposed between the first bottom-side electrode 86 and the first opening-side electrode 87 to electrically insulate the first bottom-side electrode 86 and the first opening-side electrode 87. More specifically, the first intermediate insulation layer 88 covers the first bottom-side electrode 86 exposed from the first bottom-side insulation layer 84 in a region between the first bottom-side electrode 86 and the first opening-side electrode 87. The first intermediate insulation layer 88 covers the upper end portion (more specifically, protruded portion) of the first bottom-side electrode 86. The first intermediate insulation layer 88 is continuous with the first insulation layer 82 (first bottom-side insulation layer 84).

The first intermediate insulation layer 88 has a third thickness T3. The third thickness T3 is less than the first thickness T1 of the first bottom-side insulation layer 84 (T3<T1). The third thickness T3 may be from not less than 1/100 to not more than 1/10 of the thickness T1. The third thickness T3 may be from not less than 100 Å to not more than 500 Å. The third thickness T3 may be from not less than 100 Å to not more than 200 Å, from not less than 200 Å to not more than 300 Å, from not less than 300 Å to not more than 400 Å, or from not less than 400 Å to not more than 500 Å. The third thickness T3 is preferably from not less than 200 Å to not more than 400 Å.

The first intermediate insulation layer 88 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the first intermediate insulation layer 88 has a single layer structure composed of an $SiO_2$ layer.

In this embodiment, an exposed portion which is exposed from the first gate trench 81 in the first opening-side electrode 87 is positioned at the bottom wall 63 side of the first gate trench 81 with respect to the first main surface 3. The exposed portion of the first opening-side electrode 87 is formed in a curved shape toward the bottom wall 63 of the first gate trench 81.

The exposed portion of the first opening-side electrode 87 is covered by a first cap insulation layer formed in a film shape. The first cap insulation layer is continuous with the first insulation layer 82 (first opening-side insulation layer 85) inside the first gate trench 81. The first cap insulation layer may include silicon oxide ($SiO_2$).

Each of the first FET structures 58 further includes a p-type first channel region 91 (first channel). The first channel region 91 is formed in a region which faces the first electrode 83 (first opening-side electrode 87) across the first insulation layer 82 (first opening-side insulation layer 85) in the body region 55.

The first channel region 91 is formed along the first side wall 61 or the second side wall 62 of the first trench gate structure 60, or along the first side wall 61 and the second side wall 62 thereof. In this embodiment, the first channel region 91 is formed along the first side wall 61 and the second side wall 62 of the first trench gate structure 60.

Each of the first FET structure 58 further includes an nt-type first source region 92 formed in a surface layer portion of the body region 55. The first source region 92 demarcates the first channel region 91 with the drift region 54 inside the body region 55. An n-type impurity concentration of the first source region 92 is in excess of an n-type impurity concentration of the drift region 54. The n-type impurity concentration of the first source region 92 may be from not less than $1 \times 10^{19}$ $cm^{-3}$ to not more than $1 \times 10^{21}$ $cm^{-3}$.

In this embodiment, each of the first FET structures 58 includes the plurality of first source regions 92. The plurality of first source regions 92 are formed in the surface layer portion of the body region 55 at an interval along the first trench gate structure 60. More specifically, the plurality of first source regions 92 are formed along the first side wall 61 or the second side wall 62 of the first trench gate structure 60, or along the first side wall 61 and the second side wall 62 thereof. In this embodiment, the plurality of first source regions 92 are formed at an interval along the first side wall 61 and the second side wall 62 of the first trench gate structure 60.

The bottom portions of the plurality of first source regions 92 are positioned in a region at the first main surface 3 side with respect to the bottom portion of the body region 55. Thereby, the plurality of first source regions 92 face the first electrode 83 (first opening-side electrode 87) across the first insulation layer 82 (first opening-side insulation layer 85). Thus, the first channel region 91 of the first MISFET 56 is formed in a region which is held between the plurality of first source regions 92 and the drift region 54 in the body region 55.

Each of the first FET structures 58 further includes a p+-type first contact region 93 formed in the surface layer portion of the body region 55. A p-type impurity concentration of the first contact region 93 is in excess of a p-type impurity concentration of the body region 55. The p-type impurity concentration of the first contact region 93 may be, for example, from not less than $1 \times 10^{19}$ $cm^{-3}$ to not more than $1 \times 10^{21}$ $cm^{-3}$.

In this embodiment, each of the first FET structure 58 includes a plurality of first contact regions 93. The plurality of first contact regions 93 are formed in the surface layer portion of the body region 55 at an interval along the first trench gate structure 60. More specifically, the plurality of first contact regions 93 are formed along the first side wall 61 or the second side wall 62 of the first trench gate structure 60, or along the first side wall 61 and the second side wall 62 thereof.

In this embodiment, the plurality of first contact regions 93 are formed at an interval along the first side wall 61 and the second side wall 62 of the first trench gate structure 60. More specifically, the plurality of first contact regions 93 are formed in the surface layer portion of the body region SS in a manner that the plurality of first contact regions 93 are alternately arrayed with the plurality of first source regions 92. The bottom portions of the plurality of first contact regions 93 are positioned in a region at the first main surface 3 side with respect to the bottom portion of the body region 55.

The second trench gate structure 70 includes a second gate trench 101, a second insulation layer 102, and a second electrode 103. The second gate trench 101 is formed by digging down the first main surface 3 toward the second main surface 4 side.

The second gate trench 101 defines the first side wall 71, the second side wall 72, and the bottom wall 73 of the second trench gate structure 70. Hereinafter, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along an inner wall of the second gate trench 101. The second insulation layer 102 defines a concave space inside the second gate trench 101. A part which covers the bottom wall 73 of the second gate trench 101 in the second insulation layer 102 is conformally formed along the bottom wall 73 of the second gate trench 101. Thereby, the second insulation layer 102 defines a U letter space recessed in a U letter shape inside the second gate trench 101.

The second insulation layer 102 includes at least any one of silicon oxide ($SiO_2$), silicon nitride (SiN), aluminum oxide ($Al_2O_3$), zirconium oxide ($ZrO_2$), and tantalum oxide ($Ta_2O_3$).

The second insulation layer 102 may have a laminated structure including an SiN layer and an $SiO_2$ layer formed in that order from the semiconductor layer 2 side. The second insulation layer 102 may have a laminated structure including an $SiO_2$ layer and an SiN layer formed in that order from the semiconductor layer 2 side. The second insulation layer 102 has a single layer structure composed of an $SiO_2$ layer or an SiN layer. In this embodiment, the second insulation layer 102 has a single layer structure composed of an $SiO_2$ layer.

The second insulation layer 102 includes a second bottom-side insulation layer 104 and a second opening-side insulation layer 105 which are formed in this order from the bottom wall 73 side of the second gate trench 101 to the first main surface 3 side.

The second bottom-side insulation layer 104 covers the inner wall of the second gate trench 101 at the bottom wall 73 side. More specifically, the second bottom-side insulation layer 104 covers the inner wall of the second gate trench 101 at the bottom wall 73 side with respect to the bottom portion of the body region 55. The second bottom-side insulation layer 104 defines a U letter space at the bottom wall 73 side of the second gate trench 101. The second bottom-side insulation layer 104 has a smooth inner wall surface which defines the U letter space. The second bottom-side insulation layer 104 is in contact with the drift region 54. A part of the second bottom-side insulation layer 104 may be in contact with the body region 55.

The second opening-side insulation layer 105 covers the inner wall of the second gate trench 101 at the opening side. More specifically, the second opening-side insulation layer 105 covers the first side wall 71 and the second side wall 72 of the second gate trench 101 in a region of the second gate trench 101 at the opening side with respect to the bottom portion of the body region 55. The second opening-side insulation layer 105 is in contact with the body region 55. A part of the second opening-side insulation layer 105 may be in contact with the drift region 54.

The second bottom-side insulation layer 104 has a fourth thickness T4. The second opening-side insulation layer 105 has a fifth thickness T5 less than the fourth thickness T4 (T5<T4). The fourth thickness T4 is a thickness of the second bottom-side insulation layer 104 along a normal direction of the inner wall of the second gate trench 101. The fifth thickness T5 is a thickness of the second opening-side insulation layer 105 along the normal direction of the inner wall of the second gate trench 101.

A second ratio T4/WT2 of the fourth thickness T4 with respect to the second width WT2 of the second gate trench 101, may be from not less than 0.1 to not more than 0.4.

The second ratio T4/WT2 may be, for example, from not less than 0.1 to not more than 0.15, from not less than 0.15 to not more than 0.2, from not less than 0.2 to not more than 0.25, from not less than 0.25 to not more than 0.3, from not less than 0.3 to not more than 0.35, or from not less than 0.35 to not more than 0.4. The second ratio T4/WT2 is preferably from not less than 0.25 to not more than 0.35.

The second ratio T4/WT2 may be equal to or less than the first ratio T1/WT1 (T4/WT2≤T1/WT1). The second ratio T4/WT2 may be equal to or more than the first ratio T1/WT1 (T4/WT2>T1/WT1). Instead, the second ratio T4/WT2 may be equal to the first ratio T1/WT1 (T4/WT2=T1/WT1).

The fourth thickness T4 of the second bottom-side insulation layer 104 may be from not less than 1500 Å to not more than 4000 Å. The fourth thickness T4 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The fourth thickness T4 is preferably from not less than 1800 Å to not more than 3500 Å.

The fourth thickness T4 may be from not less than 4000 Å to not more than 12000 Å according to the second width WT2 of the second gate trench 101. The fourth thickness T4 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the second bottom-side insulation layer 104, it becomes possible to increase a withstand voltage of the semiconductor device 1.

The fourth thickness T4 may be equal to or less than the first thickness T1 (T4≤T1). The fourth thickness T4 may be equal to or more than the first thickness T1 (T4≥T1). The fourth thickness T4 may be equal to the first thickness T1 (T4=T1).

The fifth thickness T5 of the second opening-side insulation layer 105 is less than the fourth thickness T4 of the second bottom-side insulation layer 104 (T5<T4). The fifth thickness T5 may be from not less than 1/100 of the fourth thickness T4 to not more than 1/10. The fifth thickness T5 may be from not less than 100 Å to not more than 500 Å. The fifth thickness T5 may be from not less than 100 Å to not more than 200 Å, from not less than 200 Å to not more than 300 Å, from not less than 300 Å to not more than 400 Å, or from not less than 400 Å to not more than 500 Å. The fifth thickness T5 is preferably from not less than 200 Å to not more than 400 Å.

The fifth thickness T5 may be equal to or less than the second thickness T2 (T5≤T2). The fifth thickness T5 may be equal to or more than the second thickness T2 (T5>T2). The fifth thickness T5 may be equal to the second thickness T2 (T5=T2).

The second bottom-side insulation layer 104 is formed in a manner that the fourth thickness T4 is reduced from a part which covers the first side wall 71 and the second side wall 72 of the second gate trench 101 toward a part which covers the bottom wall 73 of the second gate trench 101.

The part which covers the bottom wall 73 of the second gate trench 101 in the second bottom-side insulation layer 104 is smaller in thickness than the part which covers the first side wall 71 and the second side wall 72 of the second gate trench 101 in the second bottom-side insulation layer 104. An opening width of the U letter space defined by the second bottom-side insulation layer 104 at the bottom wall side is expanded by an amount of a reduction in the fourth thickness T4. Thereby, the U letter space is suppressed from being tapered. The above-described U letter space is formed, for example, by an etching method (for example, a wet etching method) to the inner wall of the second bottom-side insulation layer 104.

The second electrode 103 is embedded in the second gate trench 101 across the second insulation layer 102. Second gate control signals (second control signals) including an ON signal Von and an OFF signal Voff are applied to the second electrode 103.

In this embodiment, the second electrode 103 has an insulated-separation type split electrode structure including a second bottom-side electrode 106, a second opening-side electrode 107, and a second intermediate insulation layer 108. In this embodiment, the second bottom-side electrode 106 is electrically connected to the first bottom-side electrode 86. The second opening-side electrode 107 is electrically insulated from the first opening-side electrode 87.

The second bottom-side electrode 106 is embedded in the bottom wall 73 side of the second gate trench 101 across the second insulation layer 102. More specifically, the second bottom-side electrode 106 is embedded in the bottom wall 73 side of the second gate trench 101 across the second bottom-side insulation layer 104. The second bottom-side electrode 106 faces the drift region 54 across the second bottom-side insulation layer 104. A part of the second bottom-side electrode 106 may face the body region 55 across the second bottom-side insulation layer 104.

The second bottom-side electrode 106 defines an inverted concave recess in sectional view between the second bottom-side insulation layer 104 and the second opening-side insulation layer 105 at the opening side of the second gate trench 101. According to the above-described structure, since it is possible to suppress a local electric field concentration on the second bottom-side electrode 106, it is possible to suppress a reduction in breakdown voltage. In particular, by embedding the second bottom-side electrode 106 into the U letter space expanded by the second bottom-side insulation layer 104, it becomes possible to appropriately suppress the second bottom-side electrode 106 from being tapered from the upper end portion to the lower end portion. Thereby, it is possible to appropriately suppress a local electric field concentration at the lower end portion of the second bottom-side electrode 106.

The second bottom-side electrode 106 may include at least any one of conductive polysilicon, tungsten, aluminum, copper, an aluminum alloy, and a copper alloy. In this embodiment, the second bottom-side electrode 106 includes conductive polysilicon. The conductive polysilicon may include an n-type impurity or a p-type impurity. The conductive polysilicon preferably includes an n-type impurity.

The second opening-side electrode 107 is embedded in the opening side of the second gate trench 101 across the second insulation layer 102. More specifically, the second opening-side electrode 107 is embedded in the inverted concave recess defined at the opening side of the second gate trench 101 across the second opening-side insulation layer 105. The second opening-side electrode 107 faces the body region 55 across the second opening-side insulation layer 105. A part of the second opening-side electrode 107 may face the drift region 54 across the second opening-side insulation layer 105.

The second opening-side electrode 107 may include at least any one of conductive polysilicon, tungsten, aluminum, copper, an aluminum alloy, and a copper alloy. The second opening-side electrode 107 preferably includes the same type of conductive material as the second bottom-side electrode 106. In t¥@his embodiment, the second opening-side electrode 107 includes conductive polysilicon. The conductive polysilicon may include an n-type impurity or a p-type impurity. The conductive polysilicon preferably includes an n-type impurity.

The second intermediate insulation layer 108 is interposed between the second bottom-side electrode 106 and the second opening-side electrode 107 to electrically insulate the second bottom-side electrode 106 and the second opening-side electrode 107. More specifically, the second intermediate insulation layer 108 covers the second bottom-side electrode 106 exposed from the second bottom-side insulation layer 104 in a region between the second bottom-side electrode 106 and the second opening-side electrode 107. The second intermediate insulation layer 108 covers the upper end portion of the second bottom-side electrode 106 (more specifically, a protruded portion). The second intermediate insulation layer 108 is continuous with the second insulation layer 102 (second bottom-side insulation layer 104).

The second intermediate insulation layer 108 has a sixth thickness T6. The sixth thickness T6 is less than the fourth thickness T4 of the second bottom-side insulation layer 104 (T6<T4). The sixth thickness T6 may be from not less than $\frac{1}{100}$ of the fourth thickness T4 to not more than $\frac{1}{10}$. The sixth thickness T6 may be from not less than 100 Å to not more than 500 Å. The sixth thickness T6 may be from not less than 100 Å to not more than 200 Å, from not less than 200 Å to not more than 300 Å, from not less than 300 Å to not more than 400 Å, or from not less than 400 Å to not more than 500 Å. The sixth thickness T6 is preferably from not less than 200 Å to not more than 400 Å.

The sixth thickness T6 may be equal to or less than the third thickness T3 (T6≤T3). The sixth thickness T6 may be equal to or more than the third thickness T3 (T6≥T3). The sixth thickness T6 may be equal to the third thickness T3 (T6=T3).

The second intermediate insulation layer 108 includes at least any one of silicon oxide ($SiO_2$), silicon nitride (SiN), aluminum oxide ($Al_2O_3$), zirconium oxide ($ZrO_2$), and tantalum oxide ($Ta_2O_3$). In this embodiment, the second intermediate insulation layer 108 has a single layer structure composed of an $SiO_2$ layer.

In this embodiment, an exposed portion which is exposed from the second gate trench 101 in the second opening-side electrode 107 is positioned at the bottom wall 73 side of the second gate trench 101 with respect to the first main surface 3. The exposed portion of the second opening-side electrode 107 is formed in a curved shape toward the bottom wall 73 of the second gate trench 101.

The exposed portion of the second opening-side electrode 107 is covered by a second cap insulation layer formed in a film shape. The second cap insulation layer is continuous with the second insulation layer 102 (second opening-side insulation layer 105) inside the second gate trench 101. The second cap insulation layer may include silicon oxide ($SiO_2$).

Each of the second FET structures 68 further includes a p-type second channel region 111 (second channel). More specifically, the second channel region 111 is formed in a region which faces the second electrode 103 (second opening-side electrode 107) across the second insulation layer 102 (second opening-side insulation layer 105) in the body region 55.

More specifically, the second channel region 111 is formed along the first side wall 71 or the second side wall 72 of the second trench gate structure 70, or along the first side wall 71 and the second side wall 72 thereof. In this embodiment, the second channel region 111 is formed along the first side wall 71 and the second side wall 72 of the second trench gate structure 70.

Each of the second FET structures 68 further includes an $n^+$-type second source region 112 formed in the surface layer portion of the body region 55. The second source region 112 demarcates the second channel region 111 with the drift region 54 inside the body region 55.

An n-type impurity concentration of the second source region 112 is in excess of an n-type impurity concentration of the drift region 54. The n-type impurity concentration of the second source region 112 may be from not less than $1 \times 10^{19}$ $cm^{-3}$ to not more than $1 \times 10^{21}$ $cm^{-3}$. It is preferable that the n-type impurity concentration of the second source region 112 is equal to the n-type impurity concentration of the first source region 92.

In this embodiment, each of the second FET structures 68 includes the plurality of second source regions 112. The plurality of second source regions 112 are formed in the surface layer portion of the body region 55 at an interval along the second trench gate structure 70. Specifically, the plurality of second source regions 112 are formed along the first side wall 71 or the second side wall 72 of the second trench gate structure 70, or along the first side wall 71 and the second side wall 72 thereof. In this embodiment, the plurality of second source regions 112 are formed at an interval along the first side wall 71 and the second side wall 72 of the second trench gate structure 70.

In this embodiment, each of the second source regions 112 faces each of the first source regions 92 along the first direction X. Each of the second source regions 112 is integrally formed with each of the first source regions 92. FIG. 5 shows that the first source region 92 and the second source region 112 are distinguished from each other by a boundary line. However, in actuality, there is no clear boundary line in a region between the first source region 92 and the second source region 112.

The second source regions 112 may be each formed such as to be shifted from each of the first source regions 92 in the second direction Y such as not to face some of or all of the first source regions 92 along the first direction X. That is, the plurality of first source regions 92 and the plurality of second source regions 112 may be arrayed in a staggered manner in plan view.

The bottom portions of the plurality of second source regions 112 are positioned in a region at the first main surface 3 side with respect to the bottom portion of the body region 55. Thereby, the plurality of second source regions 112 face the second electrode 103 (second opening-side electrode 107) across the second insulation layer 102 (second opening-side insulation layer 105). Thus, the second channel region 111 of the second MISFET 57 is formed in a region held between the plurality of second source regions 112 and the drift region 54 in the body region 55.

Each of the second FET structures 68 further includes a p$^+$-type second contact region 113 formed in the surface layer portion of the body region 55. A p-type impurity concentration of the second contact region 113 is in excess of a p-type impurity concentration of the body region 55. The p-type impurity concentration of the second contact region 113 may be from not less than $1\times10^{19}$ cm$^{-3}$ to not more than $1\times10^{21}$ cm$^{-3}$. It is preferable that the p-type impurity concentration of the second contact region 113 is equal to the p-type impurity concentration of the first contact region 93.

In this embodiment, each of the second FET structures 68 includes the plurality of second contact regions 113. The plurality of second contact regions 113 are formed in the surface layer portion of the body region 55 at an interval along the second trench gate structure 70. More specifically, the plurality of second contact regions 113 are formed along the first side wall 71 or the second side wall 72 of the second trench gate structure 70, or along the first side wall 71 and the second side wall 72 thereof. The bottom portions of the plurality of second contact regions 113 are positioned in a region in the first main surface 3 side with respect to the bottom portion of the body region 55.

In this embodiment, the plurality of second contact regions 113 are formed at an interval along the first side wall 71 and the second side wall 72 of the second trench gate structure 70. More specifically, the plurality of second contact regions 113 are formed in the surface layer portion of the body region 55 in a manner that the plurality of second contact regions 113 are arrayed alternately with the plurality of second source regions 112.

With reference to FIG. 5, in this embodiment, each of the second contact regions 113 faces each of the first contact regions 93 along the first direction X. Each of the second contact regions 113 is integrally formed with each of the first contact regions 93.

In FIG. 5, in order to distinguish the first contact region 93 and the second contact region 113 from the first source region 92 and the second source region 112, the first contact region 93 and the second contact region 113 are collectively indicated by a reference sign of "p$^+$."

Each of the second contact regions 113 may be formed such as to be shifted from each of the first contact regions 93 in the second direction Y such as not to face some of or all of the first contact regions 93 along the first direction X. That is, the plurality of first contact regions 93 and the plurality of second contact regions 113 may be arrayed in a staggered manner in plan view.

With reference to FIG. 5, in this embodiment, the body region 55 is exposed from a region between one end portion of the first trench gate structure 60 and one end portion of the second trench gate structure 70 in the first main surface 3 of the semiconductor layer 2. Any of the first source region 92, the first contact region 93, the second source region 112, and the second contact region 113 is not formed in the region held between one end portion of the first trench gate structure 60 and one end portion of the second trench gate structure 70 in the first main surface 3.

Similarly, although not shown in the drawings, in this embodiment, the body region 55 is exposed from a region between the other end portion of the first trench gate structure 60 and the other end portion of the second trench gate structure 70 in the first main surface 3 of the semiconductor layer 2. Any of the first source region 92, the first contact region 93, the second source region 112, and the second contact region 113 is not formed in the region held between the other end portion of the first trench gate structure 60 and the other end portion of the second trench gate structure 70.

With reference to FIG. 5, a plurality of (Here, two) trench contact structures 120 are formed in the first main surface 3 of the semiconductor layer 2. The plurality of trench contact structures 120 include a trench contact structure 120 at one side and a trench contact structure 120 at the other side.

The trench contact structure 120 at one side is positioned in a region at the side of one end portion of the first trench gate structure 60 and one end portion of the second trench gate structure 70. The trench contact structure 120 at the other side is positioned in a region at the side of the other end portion of the first trench gate structure 60 and at the other end portion of the second trench gate structure 70.

The trench contact structure 120 at the other side is substantially similar in structure to the trench contact structure 120 at one side. Hereinafter, a structure of the trench contact structure 120 at one side shall be described as an example, and a specific description of a structure of the trench contact structure 120 at the other side shall be omitted.

The trench contact structure 120 is connected to one end portion of the first trench gate structure 60 and one end portion of the second trench gate structure 70. In this embodiment, the trench contact structure 120 extends in a band shape along the first direction X in plan view.

A width WTC of the trench contact structure 120 may be from not less than 0.5 μm to not more than 5 μm. The width WTC is a width in a direction (second direction Y) orthogonal to a direction (first direction X) in which the trench contact structure 120 extends.

The width WTC may be from not less than 0.5 μm to not more than 1 μm, from not less than 1 μm to not more than 1.5 μm, from not less than 1.5 μm to not more than 2 μm, from not less than 2 μm to not more than 2.5 μm, from not less than 2.5 μm to not more than 3 μm, from not less than 3 μm to not more than 3.5 μm, from not less than 3.5 μm to not more than 4 μm, from not less than 4 μm to not more than 4.5 µm, or from not less than 4.5 µm to not more than 5 µm. The width WTC is preferably from not less than 0.8 µm to not more than 1.2 µm.

It is preferable that the width WTC is equal to the first width WT1 of the first trench gate structure 60 (WTC=WT1). It is preferable that the width WTC is equal to the second width WT2 of the second trench gate structure 70 (WTC=WT2).

The trench contact structure 120 penetrates through the body region 55 and reaches the drift region 54. A depth DTC of the trench contact structure 120 may be from not less than 1 µm to not more than 10 µm. The depth DTC may be from may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The depth DTC is preferably from not less than 2 µm to not more than 6 µm.

It is preferable that the depth DTC is equal to the first depth DT1 of the first trench gate structure 60 (DTC=DT1). It is preferable that the depth DTC is equal to the second depth DT2 of the second trench gate structure 70 (DTC=DT2).

The trench contact structure 120 includes a first side wall 121 on one side, a second side wall 122 on the other side, and a bottom wall 123 which connects the first side wall 121 and the second side wall 122. Hereinafter, the first side wall 121, the second side wall 122, and the bottom wall 123 may be collectively referred to as "an inner wall." The first side wall 121 is a connection surface which is connected to the first trench gate structure 60 and the second trench gate structure 70.

The first side wall 121, the second side wall 122, and the bottom wall 123 are positioned inside the drift region 54. The first side wall 121 and the second side wall 122 extend along the normal direction Z. The first side wall 121 and the second side wall 122 may be formed perpendicularly to the first main surface 3.

An absolute value of an angle (taper angel) formed between the first side wall 121 and the first main surface 3 inside semiconductor layer 2 may be in excess of 90° and not more than 95° (for example, approximately 91°). The absolute value of an angle (taper angel) formed between the second side wall 122 and the first main surface 3 inside the semiconductor layer 2 may be in excess of 90° and not more than 95° (for example, approximately 91°). The trench contact structure 120 may be formed in a shape (tapered shape) that the width WTC is made narrow from the first main surface 3 side of the semiconductor layer 2 to the bottom wall 123 side in sectional view.

The bottom wall 123 is positioned in a region at the first main surface 3 side with respect to the bottom portion of the drift region 54. The bottom wall 123 is formed in a convex curved shape toward the bottom portion of the drift region 54. The bottom wall 123 is positioned in a region at the first main surface 3 side with an interval ITC of not less than 1 µm to not more than 10 µm from the bottom portion of the drift region 54. The interval ITC may be from not less than 1 µm to not more than 2 µm, from not less than 2 µm to not more than 4 µm, from not less than 4 µm to not more than 6 µm, from not less than 6 µm to not more than 8 µm, or from not less than 8 µm to not more than 10 µm. The interval ITC is preferably from not less than 1 µm to not more than 5 µm.

It is preferable that the interval ITC is equal to the first interval IT1 of the first trench gate structure 60 (ITC=IT1). It is preferable that the interval ITC is equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first main surface 3 of the semiconductor layer 2 toward the second main surface 4 side.

The contact trench 131 defines the first side wall 121, the second side wall 122, and the bottom wall 123 of the trench contact structure 120. Hereinafter, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 communicates with the first side wall 61 and the second side wall 62 of the first gate trench 81. The first side wall 121 of the contact trench 131 communicates with the first side wall 71 and the second side wall 72 of the second gate trench 101. The contact trench 131 forms one trench with the first gate trench 81 and the second gate trench 101.

The contact insulation layer 132 is formed in a film shape along an inner wall of the contact trench 131. The contact insulation layer 132 defines a concave space inside the contact trench 131. A part which covers the bottom wall 123 of the contact trench 131 in the contact insulation layer 132 is conformally formed along the bottom wall 123 of the contact trench 131.

The contact insulation layer 132 defines a U letter space recessed in a U letter shape inside the contact trench 131 in a manner similar to the first bottom-side insulation layer 84 (second bottom-side insulation layer 104). That is, the contact insulation layer 132 defines a U letter space in which a region of the contact trench 131 at the bottom wall 123 side is expanded and suppressed from being tapered. The above-described U letter space is formed, for example, by an etching method (for example, a wet etching method) to the inner wall of the contact insulation layer 132.

The contact insulation layer 132 has a seventh thickness T7. The seventh thickness T7 may be from not less than 1500 Å to not more than 4000 Å. The seventh thickness T7 may be from not less than 1500 Å to not more than 2000 Å, from not less than 2000 Å to not more than 2500 Å, from not less than 2500 Å to not more than 3000 Å, from not less than 3000 Å to not more than 3500 Å, or from not less than 3500 Å to not more than 4000 Å. The seventh thickness T7 is preferably from not less than 1800 Å to not more than 3500 Å.

The seventh thickness T7 may be from not less than 4000 Å to not more than 12000 Å according to the width WTC of the trench contact structure 120. The seventh thickness T7 may be from not less than 4000 Å to not more than 5000 Å, from not less than 5000 Å to not more than 6000 Å, from not less than 6000 Å to not more than 7000 Å, from not less than 7000 Å to not more than 8000 Å, from not less than 8000 Å to not more than 9000 Å, from not less than 9000 Å to not more than 10000 Å, from not less than 10000 Å to not more than 11000 Å, or from not less than 11000 Å to not more than 12000 Å. In this case, by increasing the thickness of the contact insulation layer 132, it becomes possible to increase a withstand voltage of the semiconductor device 1.

It is preferable that the seventh thickness T7 is equal to the first thickness T1 of the first bottom-side insulation layer 84 (T7=T1). It is preferable that the seventh thickness T7 is equal to the fourth thickness T4 of the second bottom-side insulation layer 104 (T7=T4).

The contact insulation layer 132 includes at least any one of silicon oxide (SiO$_2$), silicon nitride (SiN), aluminum oxide (Al$_2$O$_3$), zirconium oxide (ZrO$_2$), and tantalum oxide (Ta$_2$O$_3$).

The contact insulation layer 132 may have a laminated structure including an SiN layer and an SiO$_2$ layer formed in that order from the semiconductor layer 2 side. The contact insulation layer 132 may have a laminated structure including an SiO$_2$ layer and an SiN layer formed in that order from the semiconductor layer 2 side. The contact insulation layer 132 has a single layer structure composed of an SiO$_2$ layer or an SiN layer. In this embodiment, the contact insulation layer 132 has a single layer structure composed of an SiO$_2$ layer. The contact insulation layer 132 is preferably composed of the same insulating material as the first insulation layer 82 (second insulation layer 102).

The contact insulation layer 132 is integrally formed with the first insulation layer 82 in a communication portion between the first gate trench 81 and the contact trench 131. The contact insulation layer 132 is integrally formed with the second insulation layer 102 in a communication portion between the second gate trench 101 and the contact trench 131.

In this embodiment, the contact insulation layer 132 has a lead-out insulation layer 132A which is led out to one end portion of the first gate trench 81 and one end portion of the second gate trench 101. The lead-out insulation layer 132A crosses the communication portion to cover an inner wall of one end portion of the first gate trench 81. The lead-out insulation layer 132A crosses the communication portion to cover an inner wall of one end portion of the second gate trench 101.

The lead-out insulation layer 132A is integrally formed with the first bottom-side insulation layer 84 and the first opening-side insulation layer 85 inside the first gate trench 81. The lead-out insulation layer 132A defines a U letter space together with the first bottom-side insolation layer 84 at the inner wall of one end portion of the first gate trench 81.

The lead-out insulation layer 132A is integrally formed with the second bottom-side insulation layer 104 and the second opening-side insulation layer 105 inside the second gate trench 101. The lead-out insulation layer 132A defines the U letter space together with the second bottom-side insulation layer 104 at the inner wall of one end portion of the second gate trench 101.

The contact electrode 133 is embedded in the contact trench 131 across the contact insulation layer 132. The contact electrode 133 is embedded in the contact trench 131 as an integrated member unlike the first electrode 83 and the second electrode 103. The contact electrode 133 has an upper end portion exposed from the contact trench 131 and a lower end portion in contact with the contact insulation layer 132.

The lower end portion of the contact electrode 133 is formed in a convex curved shape toward the bottom wall 123 of the contact trench 131 in a manner similar to the first bottom-side electrode 86 (second bottom-side electrode 106). More specifically, the lower end portion of the contact electrode 133 is conformally formed along the bottom wall of the U letter space defined by the contact insulation layer 132 and formed in a smooth convex curved shape toward the bottom wall 123.

According to the above-described structure, since it is possible to suppress a local electric field concentration on the contact electrode 133, it is possible to suppress a reduction in breakdown voltage. In particular, by embedding the contact electrode 133 into the expanded U letter space of the contact insulation layer 132, it becomes possible to appropriately suppress the contact electrode 133 from being tapered from the upper end portion to the lower end portion. Thereby, it is possible to appropriately suppress a local electric field concentration on the lower end portion of the contact insulation layer 132.

The contact electrode 133 is electrically connected to the first bottom-side electrode 86 at the connection portion between the first gate trench 81 and the contact trench 131. The contact electrode 133 is electrically connected to the second bottom-side electrode 106 at the connection portion between the second gate trench 101 and the contact trench 131. Thereby, the second bottom-side electrode 106 is electrically connected to the first bottom-side electrode 86.

More specifically, the contact electrode 133 has a lead-out electrode 133A which is led out to one end portion of the first gate trench 81 and one end portion of the second gate trench 101. The lead-out electrode 133A crosses the communication portion between the first gate trench 81 and the contact trench 131 and is positioned inside the first gate trench 81. The lead-out electrode 133A also crosses the communication portion between the second gate trench 101 and the contact trench 131 and is positioned inside the second gate trench 101.

The lead-out electrode 133A is embedded in a U letter space defined by the contact insulation layer 132 inside the first gate trench 81. The lead-out electrode 133A is integrally formed with the first bottom-side electrode 86 inside the first gate trench 81. Thereby, the contact electrode 133 is electrically connected to the first bottom-side electrode 86.

The first intermediate insulation layer 88 is interposed between the contact electrode 133 and the first opening-side electrode 87 inside the first gate trench 81. Thereby, the contact electrode 133 is electrically insulated from the first opening-side electrode 87 inside the first gate trench 81.

The lead-out electrode 133A is embedded in the U letter space defined by the contact insulation layer 132 inside the second gate trench 101. The lead-out electrode 133A is integrally formed with the second bottom-side electrode 106 inside the second gate trench 101. Thereby, the contact electrode 133 is electrically connected to the second bottom-side electrode 106.

The second intermediate insulation layer 108 is interposed between the contact electrode 133 and the second opening-side electrode 107 inside the second gate trench 101. Thereby, the contact electrode 133 is electrically insulated from the second opening-side electrode 107 inside the second gate trench 101.

The contact electrode 133 may include at least any one of conductive polysilicon, tungsten, aluminum, copper, an aluminum alloy, and a copper alloy. In this embodiment, the contact electrode 133 may include conductive polysilicon. The conductive polysilicon may include an n-type impurity or a p-type impurity. The conductive polysilicon preferably includes an n-type impurity. It is preferable that the contact electrode 133 includes the same conductive material as the first bottom-side electrode 86 and the second bottom-side electrode 106.

In this embodiment, an exposed portion which is exposed from the contact trench 131 in the contact electrode 133 is positioned at the bottom wall 123 side of the contact trench 131 with respect to the first main surface 3. The exposed portion of the contact electrode 133 is formed in a curved shape toward the bottom wall 123 of the contact trench 131.

The exposed portion of the contact electrode 133 is covered by a third cap insulation layer 139 which is formed in a film shape. The third cap insulation layer 139 is continuous with the contact insulation layer 132 inside the contact trench 131. The third cap insulation layer 139 may include silicon oxide ($SiO_2$).

The gate control signal input from the control IC 10 to the first gate control wiring 17A (not shown) is transmitted to the first opening-side electrode 87. The gate control signal input from the control IC 10 to the second gate control wiring 17B (not shown) is transmitted to the second opening-side electrode 107. The gate control signal input from the control IC 10 to the third gate control wiring 17C (not shown) is transmitted to the first bottom-side electrode 86 and the second bottom-side electrode 106 through the contact electrode 133.

In a case where the first MISFET 56 (first trench gate structure 60) and the second MISFET 57 (second trench gate structure 70) are both controlled to be in the OFF states, the first channel region 91 and the second channel region 111 are both controlled to be in the OFF states.

In a case where the first MISFET 56 and the second MISFET 57 are both controlled to be in the ON states, the first channel region 91 and the second channel region 111 are both controlled to be in the ON states (Full-ON control).

In a case where the first MISFET 56 is controlled to be in the ON state while the second MISFET 57 is controlled to be in the OFF state, the first channel region 91 is controlled to be in the ON state and the second channel region 111 is controlled to be in the OFF state (first Half-ON control).

In a case where the first MISFET 56 is controlled to be in the OFF state while the second MISFET 57 is controlled to be in the ON state, the first channel region 91 is controlled to be in the OFF state and the second channel region 111 is controlled to be in the ON state (second Half-ON control).

As described above, in the power MISFET 9, the first MISFET 56 and the second MISFET 57 formed in one output region 6 are used to realize plural types of control including Full-ON control, first Half-ON control, and second Half-ON control.

When the first MISFET 56 is driven (that is, when the gate is controlled to be in the ON state), the ON signal Von may be applied to the first bottom-side electrode 86 and the ON signal Von may be applied to the first opening-side electrode 87. In this case, the first bottom-side electrode 86 and the first opening-side electrode 87 each function as a gate electrode.

Thereby, it is possible to suppress a voltage drop between the first bottom-side electrode 86 and the first opening-side electrode 87 and therefore it is possible to suppress an electric field concentration between the first bottom-side electrode 86 and the first opening-side electrode 87. It is also possible to reduce an ON resistance of the semiconductor layer 2 and therefore it is thereby possible to reduce electricity consumption.

When the first MISFET 56 is driven (that is, when the gate is controlled to be in the ON state), the OFF signal Voff (for example, the reference voltage) may be applied to the first bottom-side electrode 86 and the ON signal Von may be applied to the first opening-side electrode 87. In this case, while the first bottom-side electrode 86 functions as a field electrode, the first opening-side electrode 87 functions as a gate electrode. Thereby, it is possible to reduce a parasitic capacitance and therefore it is possible to improve a switching speed.

When the second MISFET 57 is driven (that is, when the gate is controlled to be in the ON state), the ON signal Von may be applied to the second bottom-side electrode 106 and the ON signal Von may be applied to the second opening-side electrode 107. In this case, the second bottom-side electrode 106 and the second opening-side electrode 107 each function as a gate electrode.

Thereby, it is possible to suppress a voltage drop between the second bottom-side electrode 106 and the second opening-side electrode 107 and therefore it is possible to suppress an electric field concentration between the second bottom-side electrode 106 and the second opening-side electrode 107. It is also possible to reduce an ON resistance of the semiconductor layer 2 and therefore it is possible to reduce electricity consumption.

When the second MISFET 57 is driven (that is, when the gate is controlled to be in the ON state), the OFF signal Voff (reference voltage) may be applied to the second bottom-side electrode 106 and the ON signal Von may be applied to the second opening-side electrode 107. In this case, while the second bottom-side electrode 106 functions as a field electrode, the second opening-side electrode 107 functions as a gate electrode. Thereby, it is possible to reduce a parasitic capacitance and therefore it is possible to improve a switching speed.

With reference to FIG. 5, the first channel region 91 is formed in each of the cell regions 75 at a first channel area S1. The first channel area S1 is defined by a total planar area of the plurality of first source regions 92 formed in each of the cell regions 75.

The first channel region 91 is formed in each of the cell regions 75 at a first channel rate R1 (first rate) (with a first channel ratio R1 (first ratio)). The first channel rate R1 is a rate which is occupied by the first channel area S1 in each of the cell regions 75 when a planar area of each cell region 75 is given as 100%.

The first channel rate R1 is adjusted to a range from not less than 0% to not more than 50%. The first channel rate R1 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The first channel rate RI is preferably from not less than 10% to not more than 35%.

In a case where the first channel rate R1 is 50%, the first source region 92 is formed in a substantially entire region of the first side wall 61 and the second side wall 62 of the first trench gate structure 60. In this case, no first contact region 93 is formed at the first side wall 61 side or the second side wall 62 side of the first trench gate structure 60. The first channel rate R1 is preferably less than 50%.

In a case where the first channel rate R1 is 0%, no first source region 92 is formed in the first side wall 61 side or the second side wall 62 side of the first trench gate structure 60. In this case, only the body region 55 and/or the first contact region 93 are formed in the first side wall 61 side and the second side wall 62 side of the first trench gate structure 60. The first channel rate R1 is preferably in excess of 0%. In this embodiment, an example in which the first channel rate R1 is 25% is shown.

The second channel region 111 is formed in each of the cell regions 75 at a second channel area S2. The second channel area S2 is defined by a total planar area of the plurality of second source regions 112 formed in each of the cell regions 75.

The second channel region 111 is formed in each of the cell regions 75 at a second channel rate R2 (second rate)

(with a second channel ratio R2 (second ratio)). The second channel rate R2 is a rate which is occupied by the second channel area S2 in each of the cell regions 75 when a planar area of each of the cell regions 75 is given as 100%.

The second channel rate R2 is adjusted to a range from not less than 0% to not more than 50%. The second channel rate R2 may be from not less than 0% to not more than 5%, from not less than 5% to not more than 10%, from not less than 10% to not more than 15%, from not less than 15% to not more than 20%, from not less than 20% to not more than 25%, from not less than 25% to not more than 30%, from not less than 30% to not more than 35%, from not less than 35% to not more than 40%, from not less than 40% to not more than 45%, or from not less than 45% to not more than 50%. The second channel rate R2 is preferably from not less than 10% to not more than 35%.

In a case where the second channel rate R2 is 50%, the second source region 112 is formed in a substantially entire region of the first side wall 71 side and the second side wall 72 side of the second trench gate structure 70. In this case, no second contact region 113 is formed in the first side wall 71 side or the second side wall 72 side of the second trench gate structure 70. The second channel rate R2 is preferably less than 50%.

In a case where the second channel rate R2 is 0%, no second source region 112 is formed in the first side wall 71 side or the second side wall 72 side of the second trench gate structure 70. In this case, only the body region 55 and/or the second contact region 113 are formed in the first side wall 71 side and the second side wall 72 side of the second trench gate structure 70. The second channel rate R2 is preferably in excess of 0%. In this embodiment, an example in which the second channel rate R2 is 25% is shown.

As described above, the first channel region 91 and the second channel region 111 are formed in each of the cell regions 75 at a total channel rate RT (RT=R1+R2) from not less than 0% to not more than 100% (preferably in excess of 0% to less than 100%).

In this embodiment, the total channel rate RT in each of the cell regions 75 is 50%. In this embodiment, the total channel rates RT are all set at an equal value. Thus, an average channel rate RAV inside the output region 6 (unit area) is given as 50%. The average channel rate RAV is such that a sum of all of the total channel rates RT is divided by a total number of the total channel rates RT.

Incidentally, the total channel rate RT may be adjusted for each cell region 75. That is, the plurality of total channel rates RT different in value from each other may be each applied to each of the cell regions 75. The total channel rate RT relates to a temperature rise of the semiconductor layer 2. For example, an increase in the total channel rate RT causes a temperature rise of the semiconductor layer 2 to occur easily. On the other hand, a reduction in the total channel rate RT causes a temperature rise of the semiconductor layer 2 not to occur easily.

By using the above, the total channel rate RT may be adjusted according to a temperature distribution of the semiconductor layer 2. For example, the total channel rate RT of a region in which a temperature rise easily occurs in the semiconductor layer 2 may be made relatively small, and the total channel rate RT of a region in which a temperature rise does not easily occur in the semiconductor layer 2 may be made relatively large.

A central portion of the output region 6 can be given as an example of a region in which a temperature rise easily occurs in the semiconductor layer 2. A peripheral portion of the output region 6 can be given as an example of a region in which a temperature rise does not easily occur in the semiconductor layer 2. As a matter of course, the average channel rate RAV may be adjusted while the total channel rate RT is adjusted according to a temperature distribution of the semiconductor layer 2.

The plurality of cell regions 75 having the total channel rate RT of not less than 20% to not more than 40% (for example, 25%) may be concentrated at a region in which a temperature rise easily occurs (for example, a central portion). The plurality of cell regions 75 having the total channel rate RT of not less than 60% to not more than 80% (for example, 75%) may be concentrated at a region in which a temperature rise does not easily occur (for example, a peripheral portion). The plurality of cell regions 75 having the total channel rate RT in excess of 40% and less than 60% (for example, 50%) may be concentrated between a region in which a temperature rise easily occurs and a region in which a temperature rise does not easily occur.

Further, the total channel rate RT of not less than 20% to not more than 40%, the total channel rate RT of not less than 40% to not more than 60%, and the total channel rate RT of not less than 60% to not more than 80% may be applied to the plurality of cell regions 75 in a regular arrangement.

As an example, three types of total channel rates RT which sequentially repeat in a pattern of 25% (low)→50% (middle)→75% (high) may be applied to the plurality of cell regions 75. In this case, the average channel rate RAV may be adjusted to 50%. In the case of the above-described structure, it is possible to suppress, with a relatively simple design, a biased temperature distribution in the semiconductor layer 2 to be formed. A specific configuration to which the above structure is applied is shown in the next embodiment.

Figure 6:
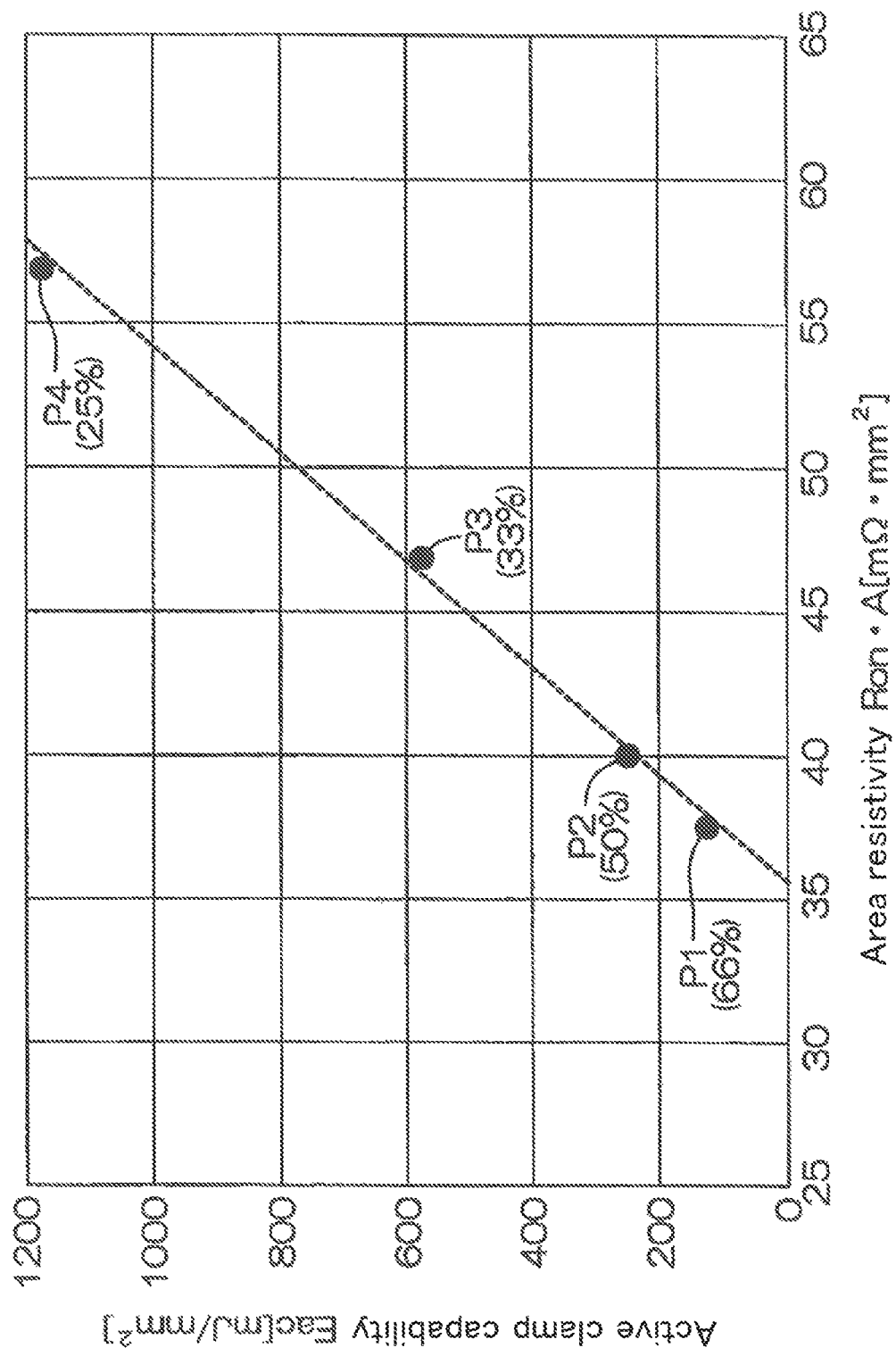
FIG. 6 is a graph showing the relationship between active clamp tolerance and area resistivity as actually observed.

FIG. 6 is a graph which is obtained by an actual measurement of a relationship between the active clamp capability Bac and an area resistivity Ron·A. The graph of FIG. 6 shows the characteristics where the first MISFET 56 and the second MISFET 57 are simultaneously controlled to be in the ON states and to be in the OFF states.

In FIG. 6, the vertical axis indicates the active clamp capability Eac [mJ/mm$^2$], while the horizontal axis indicates the area resistivity Ron·A [mΩ·mm$^2$]. As bas been described in FIG. 3, the active clamp capability Eac is the capability with respect to the counter electromotive force. The area resistivity Ron·A expresses the ON resistance inside the semiconductor layer 2 in the normal operation.

A first plot point P1, a second plot point P2, a third plot point P3, and a fourth plot point P4 are shown in FIG. 6. The first plot point P1, the second plot point P2, the third plot point P3, and the fourth plot point P4 show the respective characteristics where the average channel rate RAV (that is, a total channel rate RT occupied in each of the cell regions 75) is adjusted to 66%, 50%, 33%, and 25%.

In a case where the average channel rate RAV was increased, the area resistivity Ron·A in the normal operation was reduced and the active clamp capability Eac in the active clamp operation was reduced. In contrast thereto, where the average channel rate RAV was reduced, the area resistivity Ron·A in the normal operation was increased and the active clamp capability Eac in the active clamp operation was improved.

In view of the area resistivity Ron·A, the average channel rate RAV is preferably not less than 33% (more specifically, from not less than 33% to less than 100%). In view of the active clamp capability Eac, the average channel rate RAV is preferably less than 33% (more specifically, in excess of 0% and less than 33%).

The area resistivity Ron·A was reduced due to an increase in the average channel rate RAV, and this is because of an increase in current path. On the other hand, the active clamp capability Eac was reduced due to an increase in the average channel rate RAV, and this is because of a sharp temperature rise due to the counter electromotive force.

In particular, in a case where the average channel rate RAV (total channel rate RT) is relatively large, it is more likely that a local and sharp temperature rise may occur in a region between the first trench gate structure 60 and the second trench gate structure 70 which are adjacent to each other. It is considered that the active clamp capability Bac was reduced due to this type of temperature rise.

On the other hand, the area resistivity Ron·A was increased due to a reduction in the average channel rate RAV, and this is because of shrinkage of the current path. The active clamp capability Eac was improved due to a reduction in the average channel rate RAV, and this is considered to be because the average channel rate RAV (total channel rate RT) was made relatively small and a local and sharp temperature rise was suppressed.

From the results of the graph of FIG. 6, it is found that an adjustment method based on the average channel rate RAV (total channel rate RT) has a trade-off relationship and therefore there is a difficulty in realizing an excellent area resistivity Ron·A and an excellent active clamp capability Eac at the same time independently of the trade-off relationship.

On the other hand, from the results of the graph of FIG. 6, it is found that, by making the power MISFET 9 operate such as to approach the first plot point P1 (RAV=66%) in the normal operation and operate such as to approach the fourth plot point P4 (RAV=25%) in the active clamp operation, it is possible to realize an excellent area resistivity Ron·A and an excellent active clamp capability Eac at the same time. Thus, in this embodiment, the following control is performed.

Figure 7:
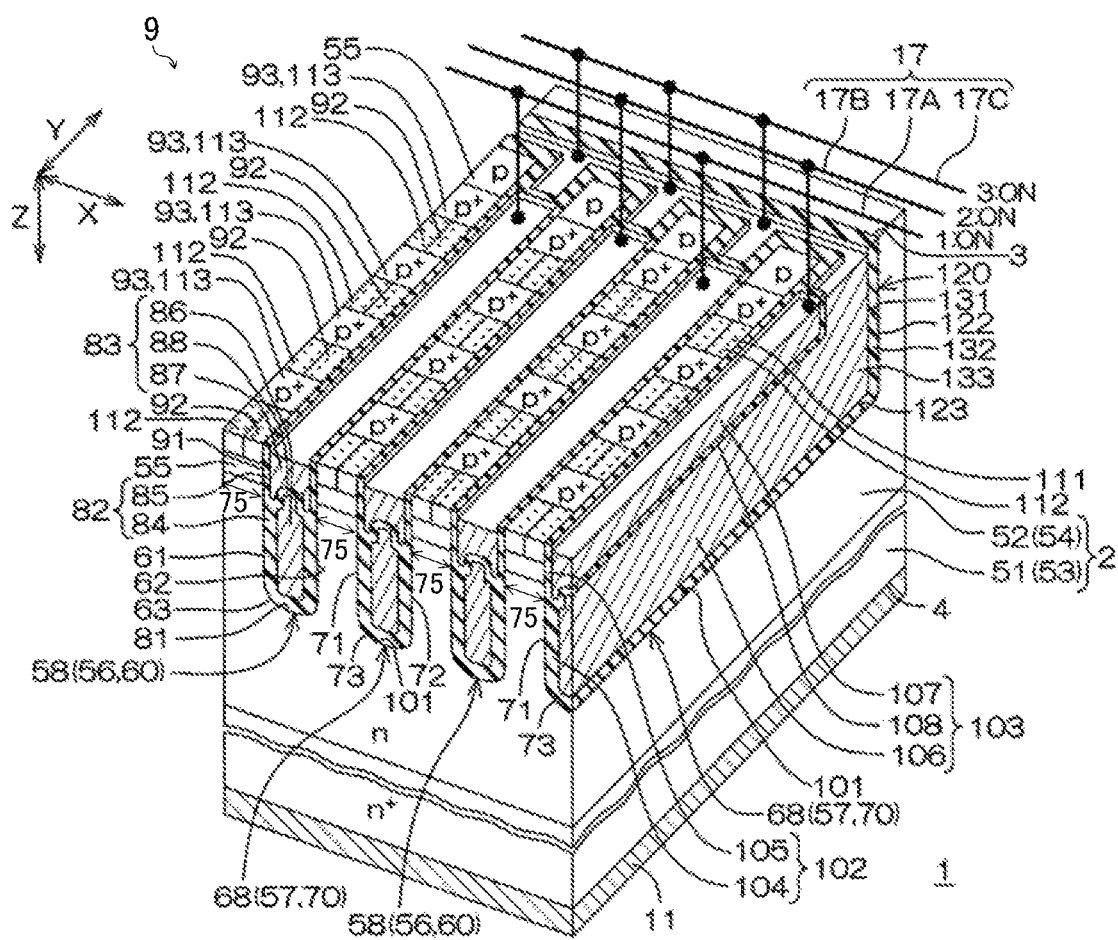
FIG. 7 is a sectional perspective view illustrating normal operation of a semiconductor device.
Figure 8:
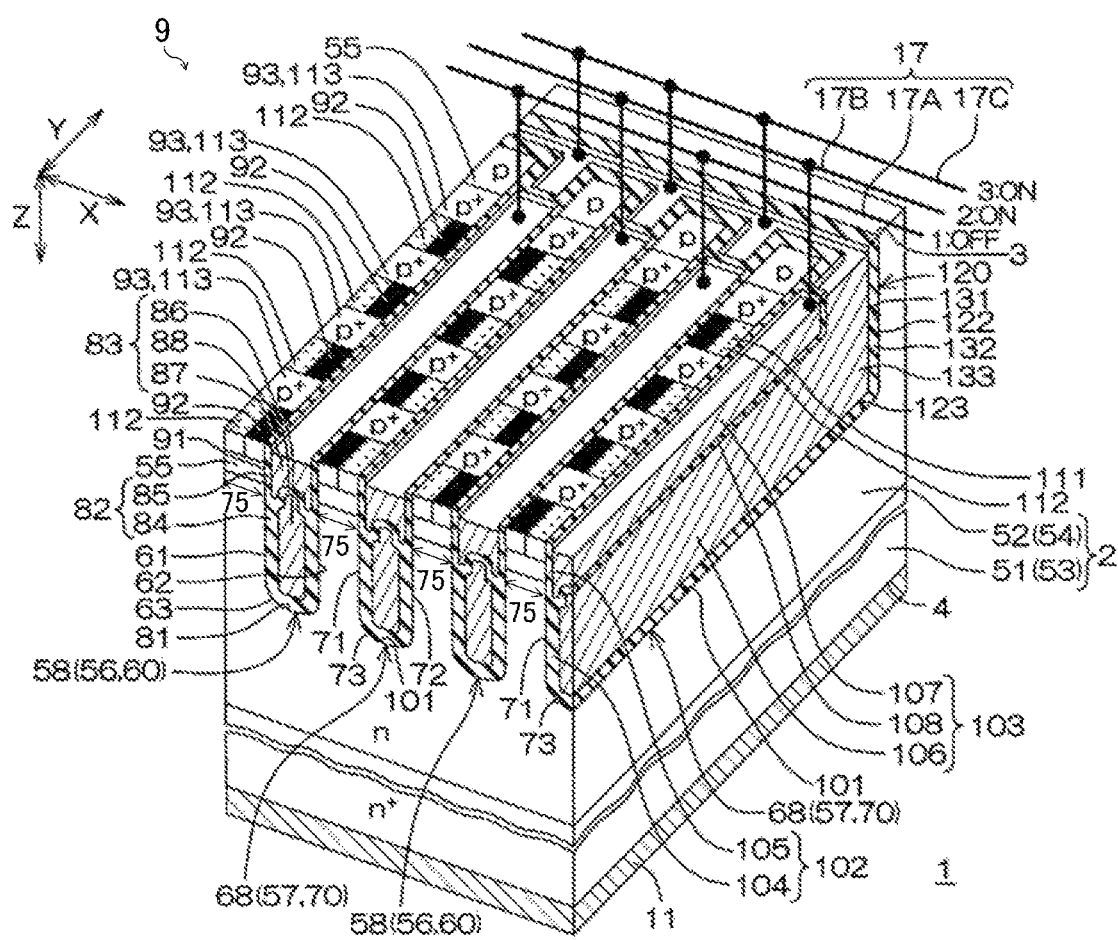
FIG. 8 is a sectional perspective view illustrating active clamp operation of a semiconductor device.

FIG. 7 is a sectional perspective view for describing the normal operation of the semiconductor device 1 shown in FIG. 1. FIG. 8 is a sectional perspective view for describing the active clamp operation of the semiconductor device 1 shown in FIG. 1. In FIG. 7 and FIG. 8, for convenience of description, structures in the first main surface 3 are omitted and the gate control wiring 17 is simplified.

With reference to FIG. 7, when the power MISFET 9 is in the normal operation, a first ON signal Von1 is input to the first gate control wiring 17A, a second ON signal Von2 is input to the second gate control wiring 17B, and a third ON signal Von3 is input to the third gate control wiring 17C.

The first ON signal Von1, the second ON signal Von2, and the third ON signal Von3 are each input from the control IC 10. The first ON signal Von1, the second ON signal Von2, and the third ON signal Von3 each have a voltage equal to or higher than the gate threshold voltage Vth. The first ON signal Von1, the second ON signal Von2, and the third ON signal Von3 may each have an equal voltage.

In this case, the first opening-side electrode 87, the second opening-side electrode 107, the first bottom-side electrode 86, and the second bottom-side electrode 106 are each put into the ON state. That is, the first opening-side electrode 87, the second opening-side electrode 107, the first bottom-side electrode 86, and the second bottom-side electrode 106 each function as a gate electrode.

Thereby, the first channel region 91 and the second channel region 111 are both controlled to be in the ON states. In FIG. 7, the first channel region 91 and the second channel region 111 in the ON states are indicated by dotted hatching.

As a result, the first MISFET 56 and the second MISFET 57 are both driven (Full-ON control). A channel utilization rate RU in the normal operation is 100%. A characteristics channel rate RC in the normal operation is 50%. The channel utilization rate RU is a rate of the first channel region 91 and the second channel region 111 which are controlled in the ON state, of the first channel region 91 and the second channel region 111.

The characteristics channel rate RC is a value obtained by multiplying the average channel rate RAV by a channel utilization rate RU (RC=RAV×RU). The characteristics (the area resistivity Ron·A and the active clamp capability Eac) of the power MISFET 9 are determined based on the characteristics channel rate RC. Thereby, the area resistivity Ron·A approaches the area resistivity Ron·A indicated by the second plot point P2 in the graph of FIG. 6.

On the other hand, with reference to FIG. 8, when the power MISFET 9 is in the active clamp operation, an OFF signal Voff is input to the first gate control wiring 17A, a first clamp ON signal VCon1 is input to the second gate control wiring 17B, and a second clamp ON signal VCon2 is input to the third gate control wiring 17C.

The OFF signal Voff, the first clamp ON signal VCon1, and the second clamp ON signal VCon2 are each input from the control IC 10. The OFF signal Voff has a voltage less than the gate threshold voltage Vth (for example, the reference voltage). The first clamp ON signal VCon1 and the second clamp ON signal VCon2 each have a voltage equal to or higher than the gate threshold voltage Vth. The first clamp ON signal VCon1 and the second clamp ON signal VCon2 may each have an equal voltage. The first clamp ON signal VCon1 and the second clamp ON signal VCon2 may have a voltage not more than or less than a voltage in the normal operation.

In this case, the first opening-side electrode 87 is put into the OFF state, and the first bottom-side electrode 86, the second bottom-side electrode 106, and the second opening-side electrode 107 are each put into the ON state. Thereby, the first channel region 91 is controlled to be in the OFF state, and the second channel region 111 is controlled to be in the ON state. In FIG. 8, the first channel region 91 in the OFF state is indicated by filled hatching, and the second channel region 111 in the ON state is indicated by dotted hatching.

As a result, while the first MISFET 56 is controlled to be in the OFF state, the second MISFET 57 is controlled to be in the ON state (second Half-ON control). Thereby, the channel utilization rate RU in the active clamp operation is in excess of zero and less than the channel utilization rate RU in the normal operation.

The channel utilization rate RU in the active clamp operation is 50%. And, the characteristics channel rate RC in the active clamp operation is 25%. Thereby, the active clamp capability Eac approaches the active clamp capability Eac indicated by the fourth plot point P4 in the graph of FIG. 6.

In this case, the control IC 10 controls the first MISFET 56 and the second MISFET 57 such that a different characteristics channel rate RC (area of channel) can be applied between the normal operation or the active clamp operation. More specifically, the control IC 10 controls the first MISFET 56 and the second MISFET 57 such that the channel utilization rate RU in the active clamp operation becomes in excess of zero and less than the channel utilization rate RU in the normal operation.

More specifically, in the normal operation, the control IC 10 keeps the first and second MISFETs 56 and 57 on and, in the active clamp operation, the control IC 10 keeps the first MISFET 56 off and the second MISFET 57 on.

Therefore, the characteristics channel rate RC relatively increases in the normal operation. That is, in the normal operation, a current can be passed by use of the first and second MISFETs 56 and 57. Thereby, a current path is relatively increased, and it becomes possible to reduce the area resistivity Ron·A (ON resistance).

On the other hand, the characteristics channel rate RC relatively reduces in the active clamp operation. That is, a current can be passed by use of the second MISFET 57 with the first MISFET 56 stopped, and thus the counter electromotive force can be consumed (absorbed) in the second MISFET 57. Thereby, it is possible to suppress a sharp temperature rise due to the counter electromotive force and therefore it is possible to improve the active clamp capability Eac.

In this way, it is possible to provide the semiconductor device 1 capable of realizing both of an excellent area resistivity Ron·A and an excellent active clamp capability Eac, independently of the trade-off relationship shown in FIG. 6.

In the example of operation described above, second Half-ON control is applied in the active clamp operation. Instead, first Half-ON control may be applied in the active clamp operation.

<Semiconductor Device (First Embodiment)>

Figure 9:
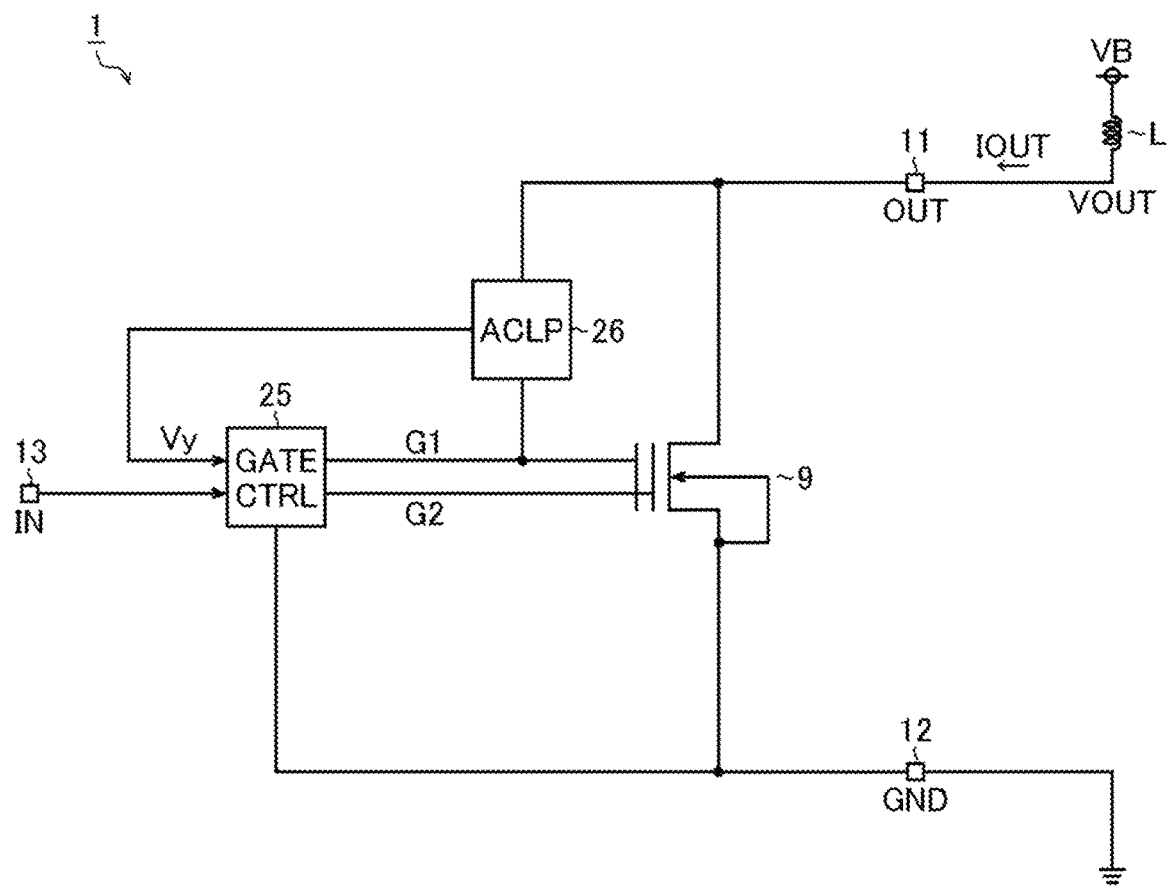
FIG. 9 is a diagram showing a semiconductor device according to a first embodiment (i.e., a circuit configuration for first Half-ON control of a power MISFET in active clamp operation).

FIG. 9 is a block circuit diagram which shows a semiconductor device 1 according to a first embodiment (=a circuit configuration for performing first Half-ON control of a power MISFET 9 during an active clamp operation).

The semiconductor device 1 according to this embodiment has the drain electrode 11 (=power supply electrode OUT), the source electrode 12 (=ground electrode GND), the power MISFET 9, the gate control circuit 25, and the active clamp circuit 26. Components already mentioned are provided with the same symbols as before.

Further, in the diagram, only part of the components are illustrated by extraction for the sake of simplification of description, however, it may be understood that the semiconductor device 1 basically includes the same components as those of the foregoing semiconductor device 1 (refer to FIG. 1).

Figure 10:
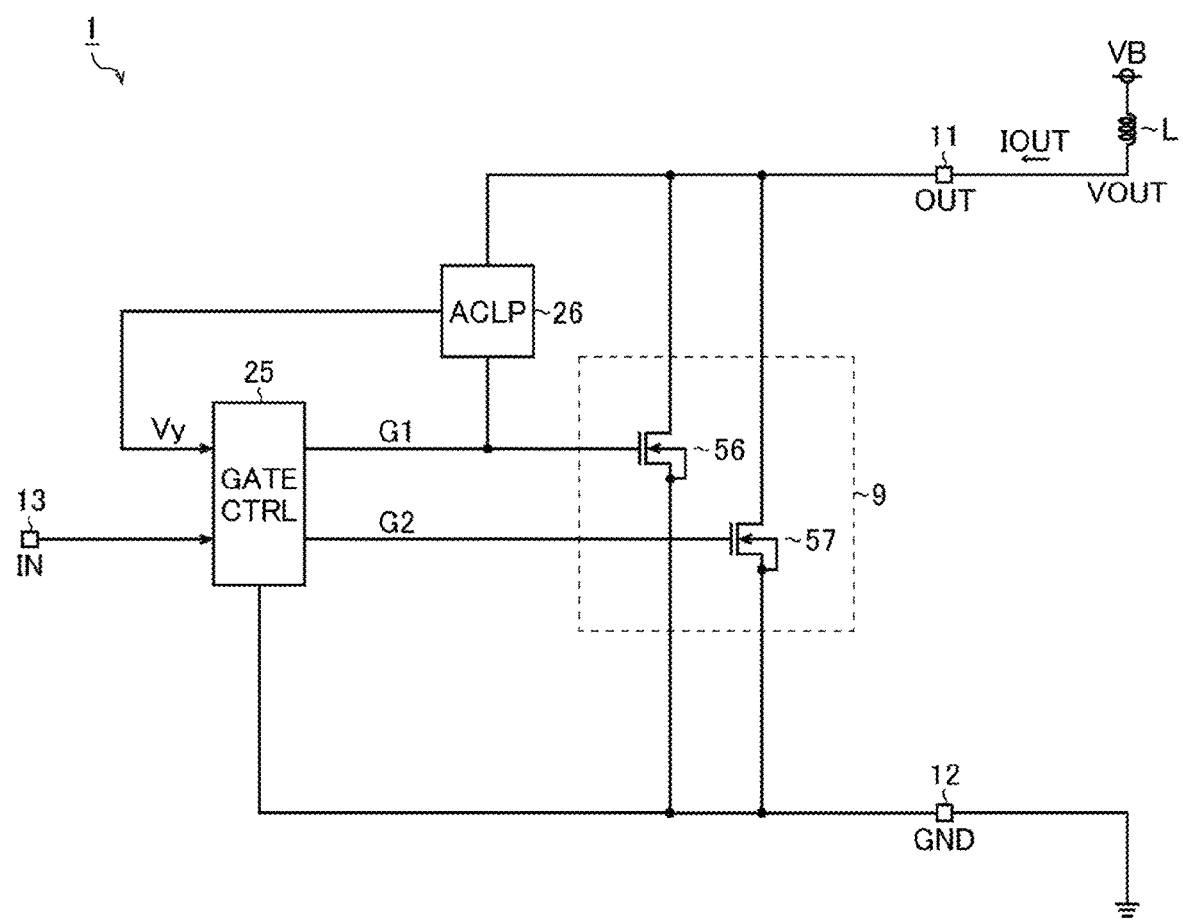
FIG. 10 is an equivalent circuit diagram in which the power MISFET in FIG. 9 is represented as a first MISFET and a second MISFET.

The power MISFET 9 is a gate divided (split-gate) device the structure of which has been described in detail so far. That is, as shown in FIG. 10, the power MISFET 9 can be equivalently represented as the first MISPET 56 and the second MISFET 57 (=which respectively correspond to a first transistor and a second transistor) that are in parallel connection.

From another point of view, it can also be understood that the first MISFET 56 and the second MISFET 57 which are respectively controlled in an independent manner are formed integrally as the power MISFET 9 that is a single gate divided device.

The gate control circuit 25 performs a gate control of the power MISFET 9 (and consequently, a gate control of each of the first MISFET 56 and the second MISFET 57). For example, the gate control circuit 25 generates gate signals G1 and G2 for the first MISFET 56 and the second MISFET 57, respectively, such as to turn on both of the first MISFET 56 and the second MISFET 57 in an enable state (=which corresponds to a first operation state) in which an external control signal IN to be input to the input electrode 13 is made high level, while turning off both of the first MISFET 56 and the second MISFET 57 in a disable state (=which corresponds to a second operation state) in which the external control signal IN is made low level.

In the semiconductor device 1 that is used as a low-side switch, not only does the external control signal IN function as an on/off control signal of the power MISFET 9, but it can also be used as a power supply voltage of the semiconductor device X2.

Further, the gate control circuit 25 accepts an input of an internal node voltage Vy from the active clamp circuit 26, and bas the function of short-circuiting between the gate and source of the second MISFET 57 after transition from the enable state (IN=H) to the disable state (IN=L) and before the active clamp circuit 26 starts its limiting operation (=before the output voltage VOUT is clamped), that is, a function of realizing the first Half-ON control of the power MISFET 9 by completely stopping the second MISFET 57 by making G2=GND.

The active clamp circuit 26 is connected between the drain and gate of the first MISFET 56, and limits a drain-source voltage (=VB−GND) of each of the first MISFET 56 and the second MISFET 57 to be equal to or less than the predetermined clamp voltage Vclp by (not fully turning off) forcibly turning on the first MISFET 56 when the output voltage VOUT of the drain electrode 11 has reached an overvoltage. Since the second MISFET 57 does not contribute to the active clamp operation, no active clamp circuit 26 is connected between the drain and gate of the second MISFET 57.

Figure 11:
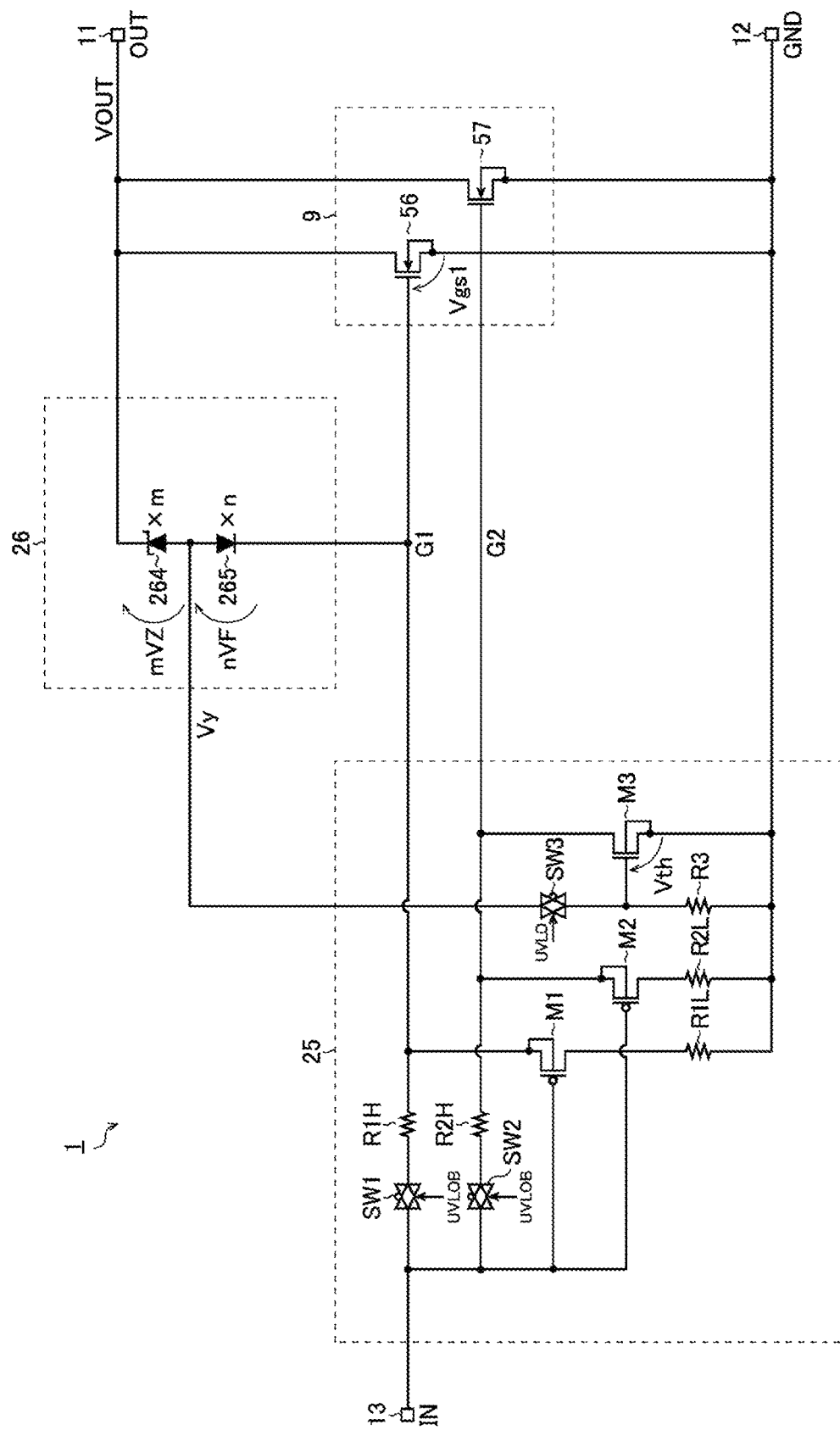
FIG. 11 is a circuit diagram showing one configuration example of the gate control circuit and the active clamp circuit in FIG. 9.

FIG. 11 is a circuit diagram which shows a construction example of the gate control circuit 25 and the active clamp circuit 26 in FIG. 9.

First, a specific description will be given of a construction of the active clamp circuit 26. The active clamp circuit 26 of the present construction example includes an m-stage (for example, m=8) Zener diode array 264 and an n-stage (for example, n=3) diode array 265.

A cathode of the Zener diode array 264 is connected to the drain electrode 11 (=which corresponds to the output electrode OUT to which the output voltage VOUT is applied) together with the drain of each of the first MISFET 56 and the second MISFET 57. As shown in the foregoing FIG. 51 and FIG. 52, the drain electrode 11 may be connected with the inductive load L such as a coil, a solenoid, etc. The anode of the Zener diode array 264 is connected to the anode of the diode array 265. A cathode of the diode array 265 is connected to the gate of the first MISFET 56 (=application terminal of the gate signal G1).

Next, a specific description will be given of a construction of the gate control circuit 25. The gate control circuit 25 of the present construction example includes P-channel type MOS field-effect transistors M1 and M2, an N-channel type MOS field-effect transistor M3, resistors R1H and R1L, resistors R2H and R2L, a resistor R3, and switches SW1 to SW3.

The switch SW1 is connected between the input electrode 13 and a first terminal of the resistor R1H (=which corresponds to a first upper resistor), and is turned on/off according to an inverted low-voltage detection signal UVLOB (=signal for which a low-voltage detection signal UVLO is inverted in logic level). More specifically, the switch SW1 is turned on when UVLOB=H (UVLO=L), and is turned off when UVLOB=L (UVLO=H).

The switch SW2 is connected between the input electrode 13 and a first terminal of the resistor R2H (=which corresponds to a second upper resistor), and is turned on/off according to the inverted low-voltage detection signal UVLOB. More specifically, the switch SW2 is turned on when UVLOB=H (UVLO=L), and is turned off when UVLOB=L (UVLO)=H).

The switch SW3 is connected between an application terminal of the internal node voltage Vy in the active clamp circuit 26 (=for example, a connection node of the Zener diode array 264 and the diode array 265) and a first terminal of the resistor R3, and is turned on/off according to the low-voltage detection signal UVLO. More specifically, the switch SW3 is turned on when UVLO=H (UVLOB=L), and is turned off when UVLO=L (UVLOB=H). The application terminal of the internal node voltage Vy is not restricted to the one described above, and for example, it is also possible to use an anode voltage of any of the n stages of diodes that form the diode array 265 as the internal node voltage Vy.

Meanwhile, the logic level of each of the low-voltage detection signal UVLO and the inverted low-voltage detection signal UVLOB is switched according to a comparison result of the external control signal IN (=which corresponds to the power supply voltage of the semiconductor device 1) with a low-voltage detection threshold Vuvlo. More specifically, when IN<Vavlo, UVLO=H and UVLOB=L (logic levels at the time of UVLO detection) are provided, the switches SW1 and SW2 are turned off and the switch SW3 is turned on. Conversely, when IN>Vuvlo, UVLO=L and UVLOB=H (logic levels at the time of UVLO cancelation) are provided, the switches SW1 and SW2 are turned on and the switch SW3 is turned off. As described above, the switches SW1 and SW2 and the switch SW3 are complementarily turned on/off.

A second terminal of the resistor R1H and a source and a back gate of the transistor M1 are connected to the gate of the first MISFET 56. A drain of the transistor M1 is connected to a first terminal of the resistor R1L (=which corresponds to a first lower resistor). A second terminal of the resistor R1L is connected to the source electrode 12 (=which corresponds to the ground electrode GND to which the ground voltage GND is applied). A gate of the transistor M1 is connected to the input electrode 13.

A second terminal of the resistor R2H and a source and a back gate of the transistor M2 are connected to the gate of the second MISFET 57. A drain of the transistor M2 is connected to a first terminal of the resistor R2L (=which corresponds to a second lower resistor). A second terminal of the resistor R2L is connected to the source electrode 12 (=which corresponds to the ground electrode GND). A gate of the transistor M2 is connected to the input electrode 13.

A drain of the transistor M3 is connected to the gate of the second MISFET 57. A gate of the transistor M3 is connected to the first terminal of the resistor R3. A source and back gate of the transistor M3 and a second gate of the resistor R3 are connected to the source electrode 12.

Hereinafter, description will be given of the first Half-ON control of the power MISFET 9 in the active clamp operation, for which the gate-source voltage of the first MISFET 56 is Vgst, an ON threshold voltage of the transistor M3 is Vth, a breakdown voltage of the Zener diode array 264 is mVZ, and a forward drop voltage of the diode array 265 is nVF.

Figure 12:
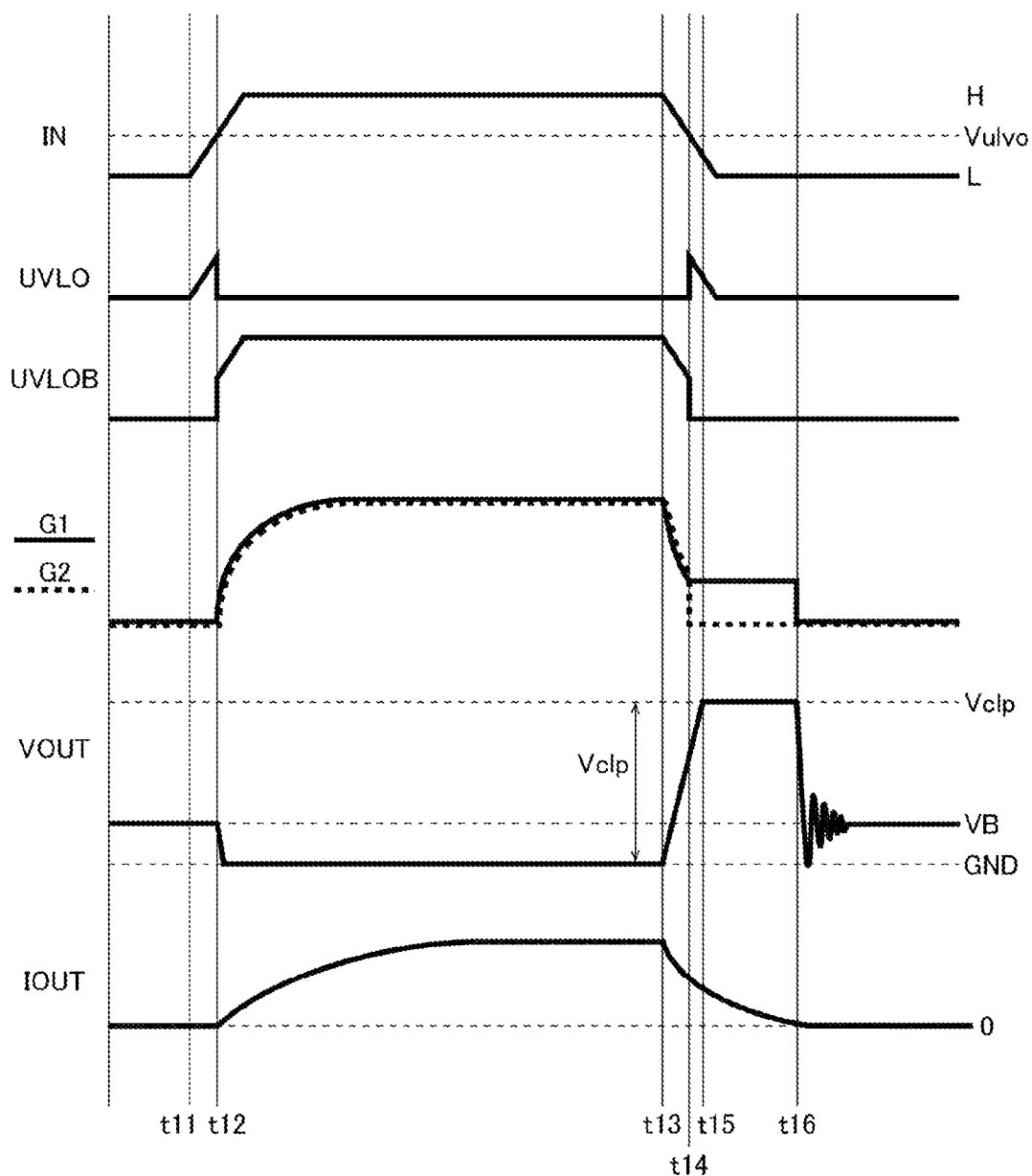
FIG. 12 is a timing chart showing first Half-ON control of a power MISFET 9 in active clamp operation in a semiconductor device.

FIG. 12 is a timing chart which shows a state of the first Half-ON control of the power MISFET 9 performed during an active clamp operation in the semiconductor device 1, for which in order from the top, an external control signal IN, a low-voltage detection signal UVLO and an inverted low-voltage detection signal UVLOB, a gate signal G1 (solid line), gate signal G2 (broken line), an output voltage VOUT, and an output current IOUT are plotted. In this figure, it is assumed that the inductive load L is connected to the drain electrode 11 (output electrode OUT).

At time t11, the external control signal IN starts to transit from a low level (=logic level when turning off the power MISFET 9) to a high level (=logic level when turning on the power MISPET 9). However, at this point in time, since IN<Vuvlo, UVLO=H and UVLOB=L. Accordingly, in the gate control circuit 25, a state in which the switches SW1 and SW2 are turned off and the switch SW3 is turned on is brought about, and the gate signals G1 and G2 are kept at low levels, so that the first MISFET 56 and the second MISFET 57 both remain to be off. As a result, no output current IOUT flows, and this results in VOUT=VB.

When the external control signal reaches IN>Vuvlo at time t12, UVLO=L and UVLOB=H are provided. Accordingly, in the gate control circuit 25, a state in which the switches SW1 and SW2 are turned on and the switch SW3 is turned off is brought about. At this time, since the gate of each of the first MISFET 56 and the second MISFET 57 and the input electrode 13 are made conductive to each other, the gate signals G1 and G2 rise to high levels, and the first MISFET 56 and the second MISFET 57 are both turned on. As a result, the output current IOUT starts to flow, so that the output voltage VOUT is reduced to nearly the ground voltage GND. This state corresponds to a Full-ON state of the power MISFET 9. Rising rates of each of the gate signals G1 and G2 (=slew rate at switch-on time) can be adjusted according to resistance values of each of the resistors R1H and R2H.

Further, since the switch SW3 is off, the node voltage Vy of the active clamp circuit 26 is not applied to the gate of the transistor M3, and the transistor M3 is not unexpectedly turned on.

Thereafter, at time t13, the external control signal IN starts to transit from the high level to the low level. As a result, the transistors M1 and M2 are turned on, and the gate of each of the first MISFET 56 and the second MISFET 57 and the source electrode 12 (=ground electrode GND) are made conductive to each other, so that the gate signals G1 and G2 are lowered, and the first MISFET 56 and the second MISFET 57 are turned to off from on. Falling rates of each of the gate signals G1 and G2 (=slew rate at switch-off time) can be adjusted according to the resistance values of each of the resistors R1L and R2L.

At this time, the inductive load L continues to allow the output current IOUT to flow until it has released energy accumulated during the ON period of the power MISFET 9. As a result, the output VOUT is sharply raised to a voltage higher than the power supply voltage VB.

However, when the output voltage VOUT is increased to the clamp voltage Vclp (=Vgs1+nVF+mVZ) at time t15, the first MISFET 56 is (not fully turned off) turned on by the operation of the active clamp circuit 26, so that the output current IOUT is discharged through the first MISPET 56. Therefore, the output voltage VOUT is limited to be equal to or less than the clamp voltage Vclp. The above-described active clamp operation is continued until time t16 at which the energy accumulated in the inductive load L has been completely released and the output current IOUT no longer flows.

On the other hand, in terms of the second MISFET 57, the external control signal reaches IN<Vuvlo at time t14, and the switch SW3 is turned on at the point in time where the low-voltage detection signal UVLO has risen from the low level to the high level, so that a state is brought about in which the node voltage Vy (>Vth) of the active clamp circuit 26 is applied to the gate of the transistor M3. Accordingly, the transistor M3 is turned on to provide short-circuiting (G2=VOUT) between the gate and source of the second MISFET 57.

That is, the second MISFET 57 is completely turned off, by the operation of the transistor M3, before the active clamp circuit 26 operates (before time t15). This state corresponds to a first Half-ON state of the power MISFET 9.

As described above, by performing switching from the Full-ON state to the first Half-ON state, the channel utilization rate RU in the active clamp operation (=time t15 to t16) becomes in excess of zero and less than the channel utilization rate RU in the normal operation (=time t11 to t13).

Therefore, the characteristics channel rate RC relatively increases in the normal operation (for example, RC=50%). Thereby, the current path is relatively increased, and it becomes possible to reduce the area resistivity Ron·A (ON resistance). On the other hand, the characteristics channel rate RC relatively reduces in the active clamp operation (for example, RC=25%). Thereby, it is possible to suppress a sharp temperature rise due to the counter electromotive force of the inductive load L and therefore it is possible to improve the active clamp capability Eac.

Thus, it becomes possible to provide a semiconductor device 1 which can realize an excellent area resistivity Ron·A and an excellent active clamp capability Eac at the same time independently of the trade-off relationship shown in FIG. 6. Particularly, in the field of IPDs, the active clamp capability Eac is one of the characteristics that are crucial for driving a greater inductive load L.

With FIG. 9 to FIG. 12, a description has been given of an example in which first Half-ON control is applied in the active clamp operation. However, second Half-ON control may be applied in the active clamp operation. In that case, it suffices to replace the first MISFET 56 and the second MISFET 57 with each other for understanding.

<Study on Output Overshoots>

Figure 13:
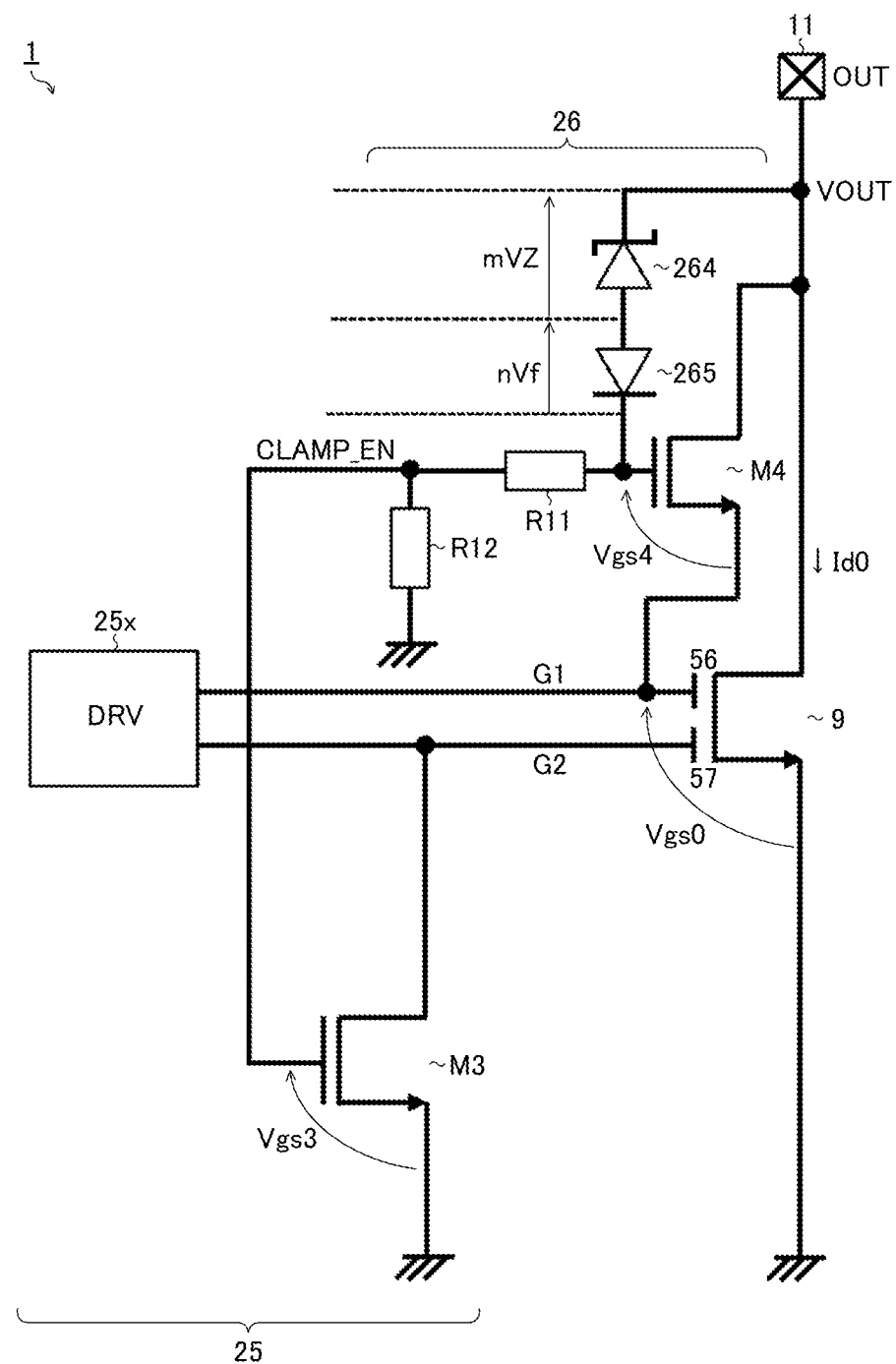
FIG. 13 is a diagram illustrating a cause of an output overshoot.

FIG. 13 is a diagram illustrating the cause of an output overshoot that can occur in the active clamp operation. The semiconductor device 1 of this configuration example, while being configured basically similarly to that according to the first embodiment (FIG. 11) described previously, has a slightly modified circuit configuration in the active clamp circuit 26 as one variation of it.

In terms of what is shown in the diagram, the active clamp circuit 26 includes, in addition to the Zener diode array 264 and the diode array 265, a transistor M4 (e.g., an N-channel MISFET) and resistor R11 and R12. The drain of the transistor M4 is connected to the drain of the power MISFET 9. The source of the transistor M4 is connected to an application terminal for the gate signal G1 (i.e., the gate of the first MISFET 56). The gate of the transistor M4 and the first terminal of the resistor R11 are connected to the cathode of the diode array 265.

The second terminal of the resistor R11 and the first terminal of the resistor R12 are connected to the gate of the transistor M3, which serves as an output terminal for a clamp enable signal CLAMP_EN (corresponding to the internal node voltage in the active clamp circuit 26). The second terminal of the resistor R12 is connected to a ground terminal As described above, the active clamp circuit 26 may additionally include the transistor M4 and the resistors R11 and R12 for adjustment of the signal level (voltage value) of the clamp enable signal CLAMP_EN.

In the semiconductor device 1 of this configuration example, the power MISFET 9 is connected between the drain electrode 11 (i.e., the output electrode OUT) and the ground electrode, and corresponds to a split-gate transistor configured such that its ON resistance varies through individual control of a plurality of channel regions by use of a plurality of gate signals G1 and G2. The power MISFET 9 includes, in equivalent terms, a first MISFET 56 and a second MISFET 57 configured to be connected in parallel between the drain electrode 11 (i.e., the output electrode OUT) and the ground electrode. This is as discussed earlier.

The gate control circuit 25, as its basic operation, controls the gates of the first and second MISFETs 56 and 57 respectively so as to keep, with the power MISFET 9 on, the first and second MISFETs 56 and 57 on and, with the power MISFET 9 off, the first and second MISFETs 56 and 57 off. The gate driver 25x in the diagram can be constituted by, for example, the switches SW1 and SW2, the transistors M1 and M2, the resistors R1H and R2H, and the resistors R1L and R2L in FIG. 11.

Moreover, the gate control circuit 25 includes the transistor M3 connected between the gate and the source of the second MISFET 57. The transistor M3 turns on when the clamp enable signal CLAMP_EN becomes higher than an ON threshold voltage Vth to short-circuit together the gate and the source of the second MISFET S7.

Thus, the second MISFET 57 is completely stopped before the active clamp circuit 26 starts its limiting operation on the output voltage VOUT. As a result the ON resistance of the power MISFET 9 is increased, and this makes it possible to increase the active clamp tolerance Eac.

However, with the semiconductor device 1 of this configuration example, an output overshoot (i.e., an unintended sharp rise in the output voltage VOUT) may occur when the second MISFET 57 turns off. Such an output overshoot may cause a voltage higher than the device withstand voltage of the power MISFET 9 to be applied to it, leading to a failure. To follow is a detailed description of the mechanism by which an output overshoot occurs.

Here, so that only the influence of the power MISFET 9 will be considered, the following definitions are used. First, with respect to the power MISFET 9, its current capacity with the first MISFET 56 on is assumed to be gm1 [S] its and current capacity with the second MISFET 57 on is assumed to be gm2 [S]. Second, the gate-source voltage Vgas3 of the transistor M3 is assumed to be constant, and the current capacity of the transistor M3 is assumed to be infinite, that is, gm3 [S]=∞. Third, the breakdown voltage mVZ of the Zener diode array 264 and the forward drop voltage nVF of the diode array 265 are both assumed to be constant (with no drift in the diodes). Fourth, the drain current in the power MISFET 9 at the moment that the second MISFET 57 turns off is assumed to be Id0.

(i) The output clamp voltage VOUT(CL)_1 observed with neither of the first and second MISFETs 56 and 57 on is given by Expression (1) below. Vgs0_1 in Expression (1) represents the gate-source voltage of the power MISFET 9 under this condition (i).

$$VOUT(CL)\_1 = Vgs0\_1 + Vgs4 + nVf + mVz \quad (1)$$

$$= Id0/(gm1 + gm2) + Vgs4 + nVf + mVz$$

(ii) The output clamp voltage VOUT(CL)_2 observed with the second MISFET 57 off is given by Expression (2)

below. Vgs0_2 in Expression (2) is the gate-source voltage of the power MISFET 9 under this condition (ii).

$$VOUT(CL)\_2 = Vgs0\_2 + Vgs4 + nVf + mVz \quad (2)$$
$$= Id0/gm1 + Vgs4 + nVf + mVz$$

(iii) The output overshoot ΔVOUT(CL) that occurs at the moment that the second MISFET 57 is turned off is given by Expression (3) below.

$$\Delta VOUT(CL) = |VOUT(CL)\_1 - VOUT(CL)\_2| \quad (3)$$
$$= |Id0/(gm1 + gm2) - Id0/gm1|$$
$$= Id0[1/gm1 - 1/(gm1 + gm2)]$$

Figure 14:
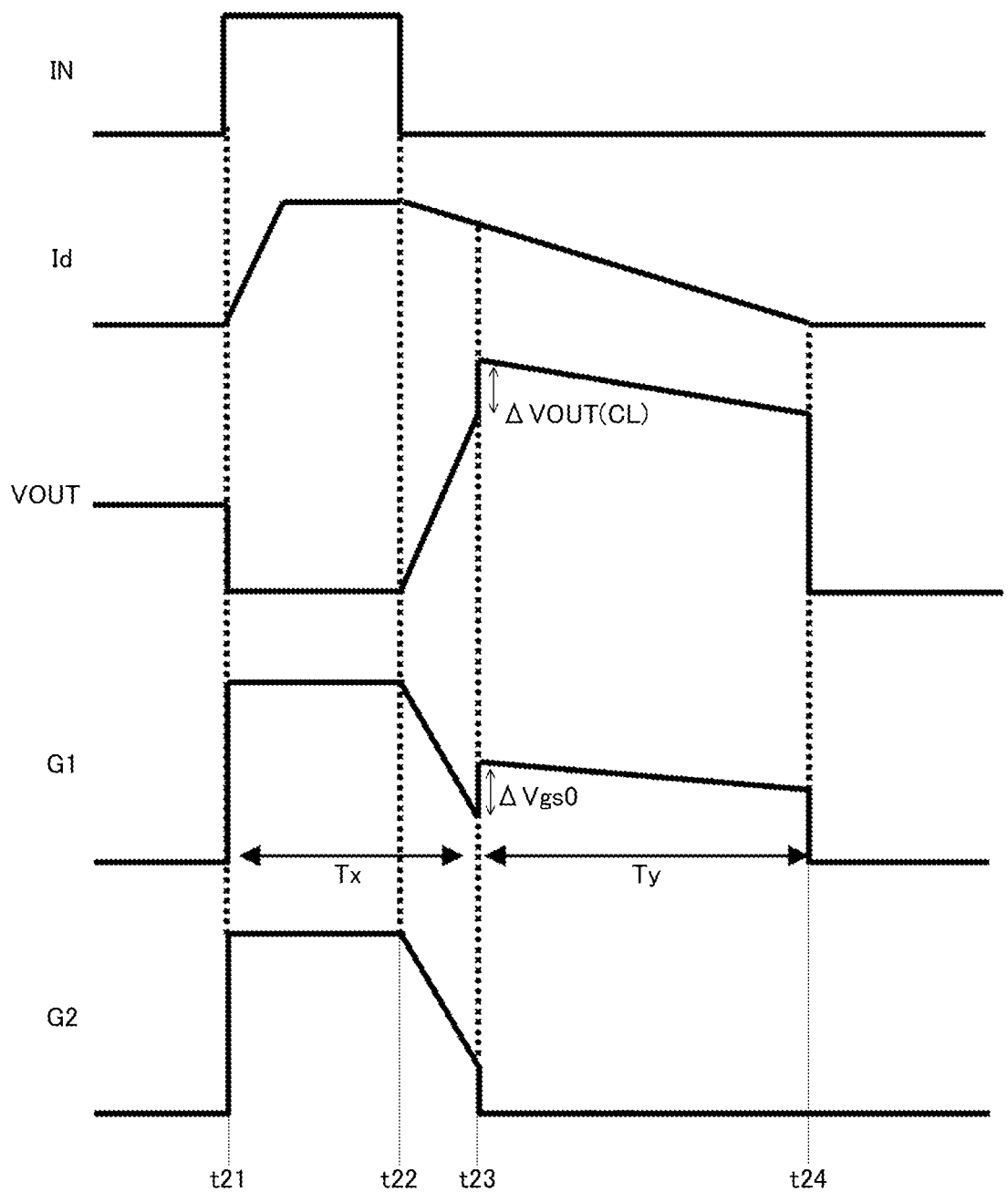
FIG. 14 is a diagram showing how an output overshoot occurs.

FIG. 14 is a timing chart showing how an output overshoot occurs, depicting, from top down, the external control signal IN, the drain current Id through the power MISFET 9, the output voltage VOUT, and the gate signals G1 and G2.

The high-level period of the external control signal IN (i.e., between time points t21 and t22) corresponds to the ON period of the power MISFET 9. Thus, in that period, the output voltage VOUT falls down almost to the ground potential and a drain current Id passes through the power MISFET 9. At this time, the gate signals G1 and G2 are both at high level and thus the first and second MISFETs 56 and 57 are both on. This state corresponds to the Full-ON state mentioned previously.

When at time point t22 the external control signal IN is dropped to low level, the gate signals G1 and G2 are dropped from the high level, and thus the first and second MISFETs 56 and 57 turn from on to off. As a result, the drain current Id starts to decrease.

At this time, the inductive load L tends to continue passing the output current IOUT until it has discharged the energy it stored during the ON period of the power MISFET 9. As a result, the output voltage VOUT sharply rises up to a voltage higher than the power supply voltage VB.

As the output voltage VOUT rises, when at time point t23 the clamp enable signal CLAMP_EN becomes higher than the ON threshold voltage Vth of the transistor M3, the transistor M3 turns on and the gate and the source of the second MISFET 57 are short-circuited together. This state corresponds to the first Half-ON state mentioned previously.

As described above, switching the power MISFET 9 from the Full-ON state to the first Half-ON state results in the channel utilization rate RU in the active clamp operation period Ty (i.e., between time points t23 and t24) exceeding zero to become less than the channel utilization rate RU in the normal operation period Tx (i.e., between time points t21 and t23).

That is, in the active clamp operation period Ty, the characteristics channel rate RC is reduced compared with in the normal operation period Tx (e.g., RC=50% to 12%). This helps suppress a sharp rise in temperature ascribable to the counter electromotive force in the inductive load L, and thus helps improve the active clamp tolerance Eac. This is as discussed earlier.

Incidentally, if the second MISFET 57 is turned off abruptly, the current capacity of the power MISFET 9 falls sharply (from gm1+fm2 to gm1). By contrast, the drain current Id0 through the power MISFET 9 at the moment that the second MISFET 57 turns off is constant. Thus, the drain current Id0, now having no place to go, causes the gate-source voltage Vgs0 of the power MISFET 9 (i.e., the gate signal G1) to rise sharply by ΔVgs0, and this provokes an output overshoot ΔVOUT(CL) to occur in the output voltage VOUT.

As will be understood from Expression (3) above, the output overshoot ΔVOUT(CL) depends on the drain current Id0 and the current capacity of the power MISFET 9 (more precisely, the variation of the current capacity [1/gm1−1/(gm1+gm2)]). Accordingly, to reduce the output overshoot ΔVOUT(CL), it is important to keep small the variation of the current capacity of the power MISFET 9. Presented below will be a novel embodiment based on the study above.

<Semiconductor Device (Second Embodiment)>

Figure 15:
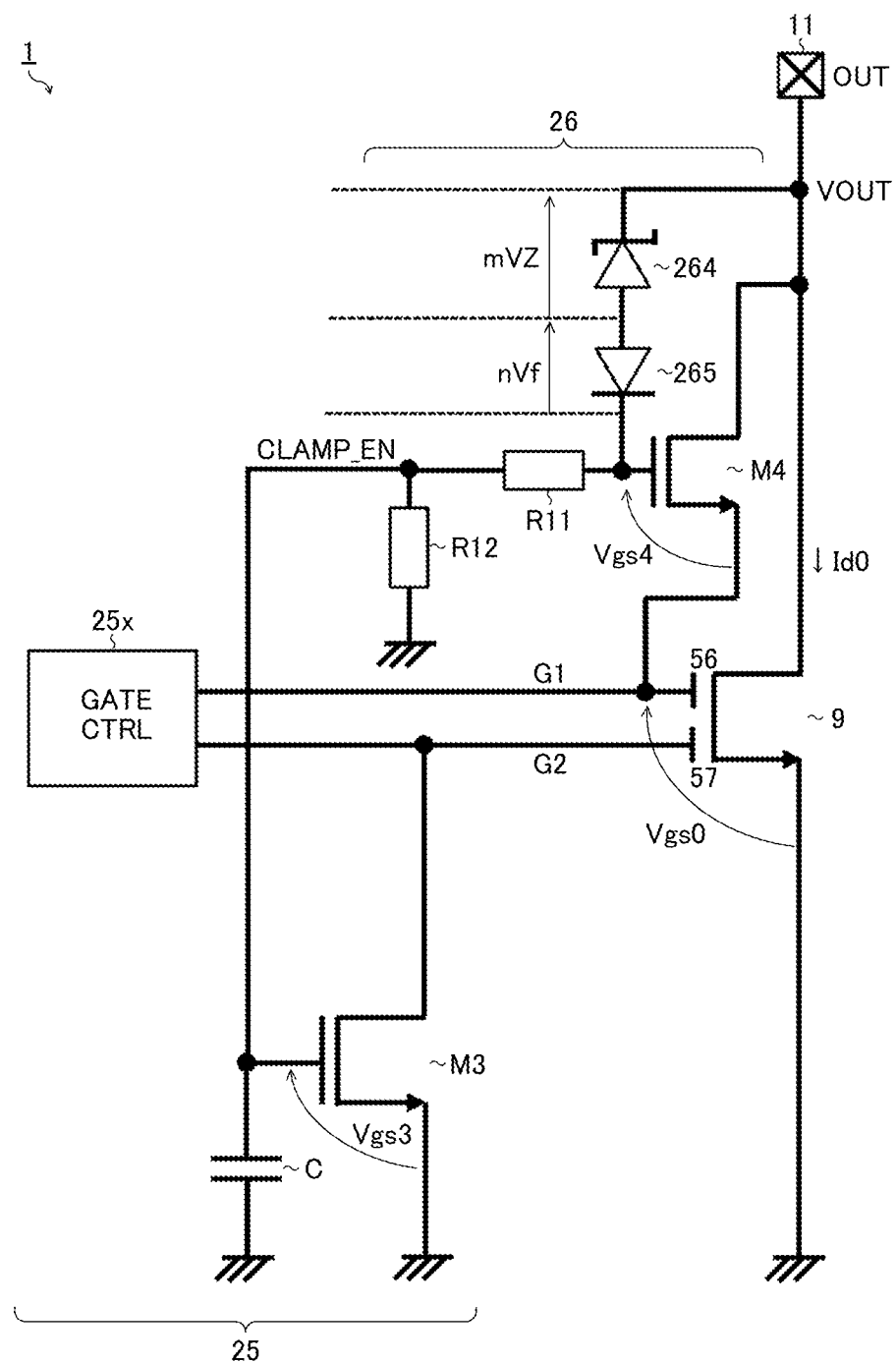
FIG. 15 is a diagram showing a semiconductor device according to a second embodiment.

FIG. 15 is a diagram showing a semiconductor device 1 according to a second embodiment. The semiconductor device 1 of this embodiment is based on what is shown in FIG. 13 referred to previously and additionally includes, as a component of the gate control circuit 25, a capacitor C connected between the gate and the source of the transistor M3.

With the just-mentioned capacitor C added, the gate voltage of the transistor M3 (i.e., the clamp enable signal CLAMP_EN) rises gently with a predetermined time constant τ. Thus, the conductivity of the transistor M3 increases gradually, and so the gate signal G2 (i.e., the gate-source voltage Vgs2 of the second MISFET 57) decreases gradually. That is, the added capacitor C gives a delay in the fall of the gate signal G2.

From a different perspective, the gate control circuit 25 can be understood to be configured to turn the power MISFET 9 from on to off and then, before the output voltage VOUT is limited by the active clamp circuit 26, gently raise the ON resistance of the power MISFET 9.

With this configuration, it is possible to gently lower the current capacity of the power MISFET 9, and thereby to suppress an output overshoot.

Incidentally, it is also possible to suppress an output overshoot ΔVOUT(CL) by connecting a capacitor between the gate and the source of the second MISFET 57. In that case, however, it should be noted that also the normal operation of the power MISFET 9 will be affected. For example, in a configuration based on what is shown in FIG. 11 referred to previously, the capacitor can be connected in parallel with the resistor R3.

Figure 16:
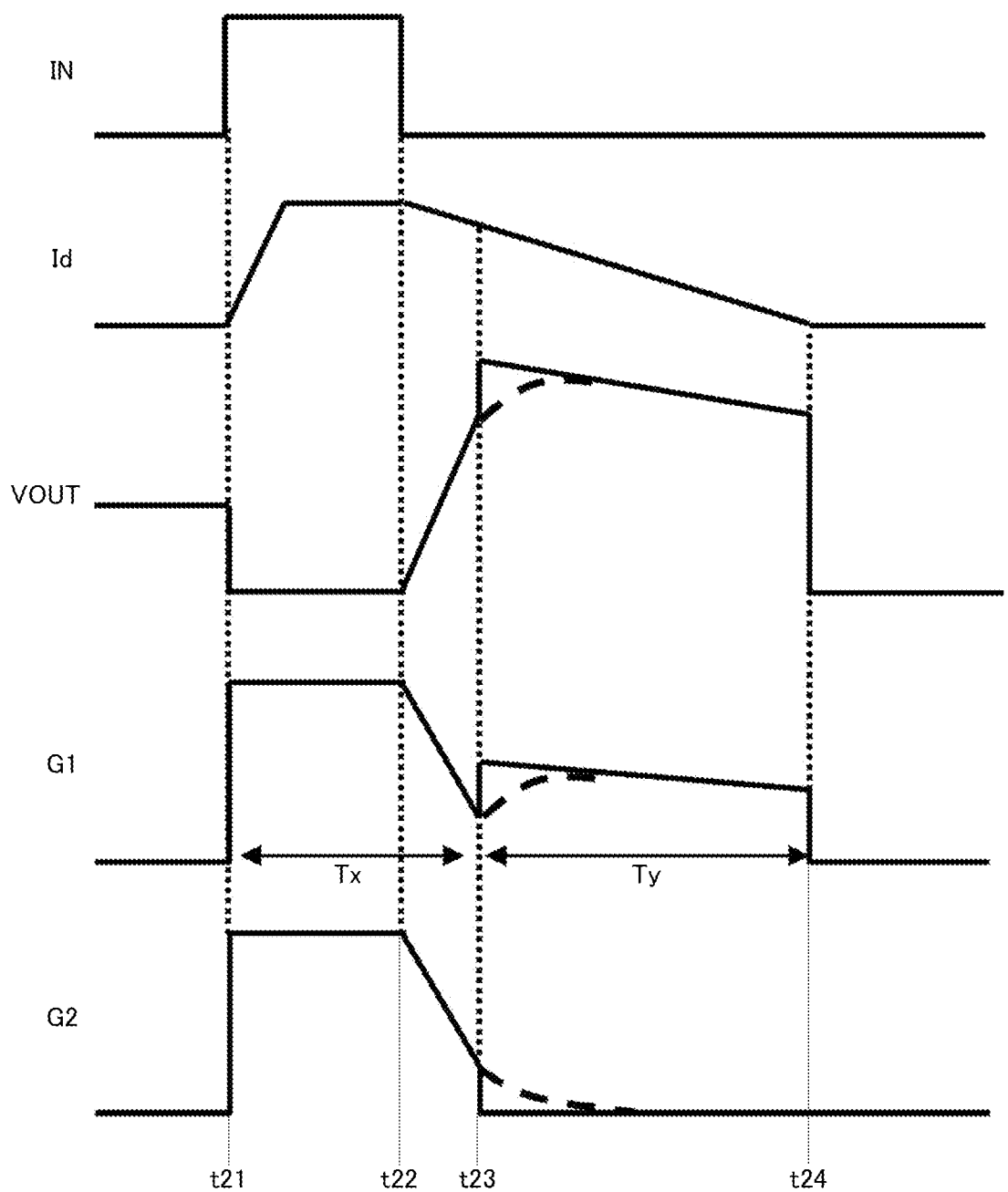
FIG. 16 is a diagram showing how an output overshoot is suppressed.

FIG. 16 is a diagram showing how an output overshoot ΔVOUT(CL) is suppressed in the semiconductor device 1 according to the second embodiment, depicting, like FIG. 14 referred to previously, from top down, the external control signal IN, the drain current Id through the power MISFET 9, the output voltage VOUT, and the gate signals G1 and G2.

As indicated by broken lines in the diagram, after time point (23 at which the transistor M3 turns on, by lowering the gate signal G2 gently, it is possible to prevent a sharp rise in the gate signal G1 (i.e., the gate-source voltage vgs0) and thereby suppress an output overshoot.

Here, the drain current Id through the power MISFET 9 decreases as the inductive load L discharges. Accordingly, by raising the ON resistance of the power MISFET 9 gently, it is possible to suppress an output overshoot.

Semiconductor Device (Second Embodiment)

Figure 17:
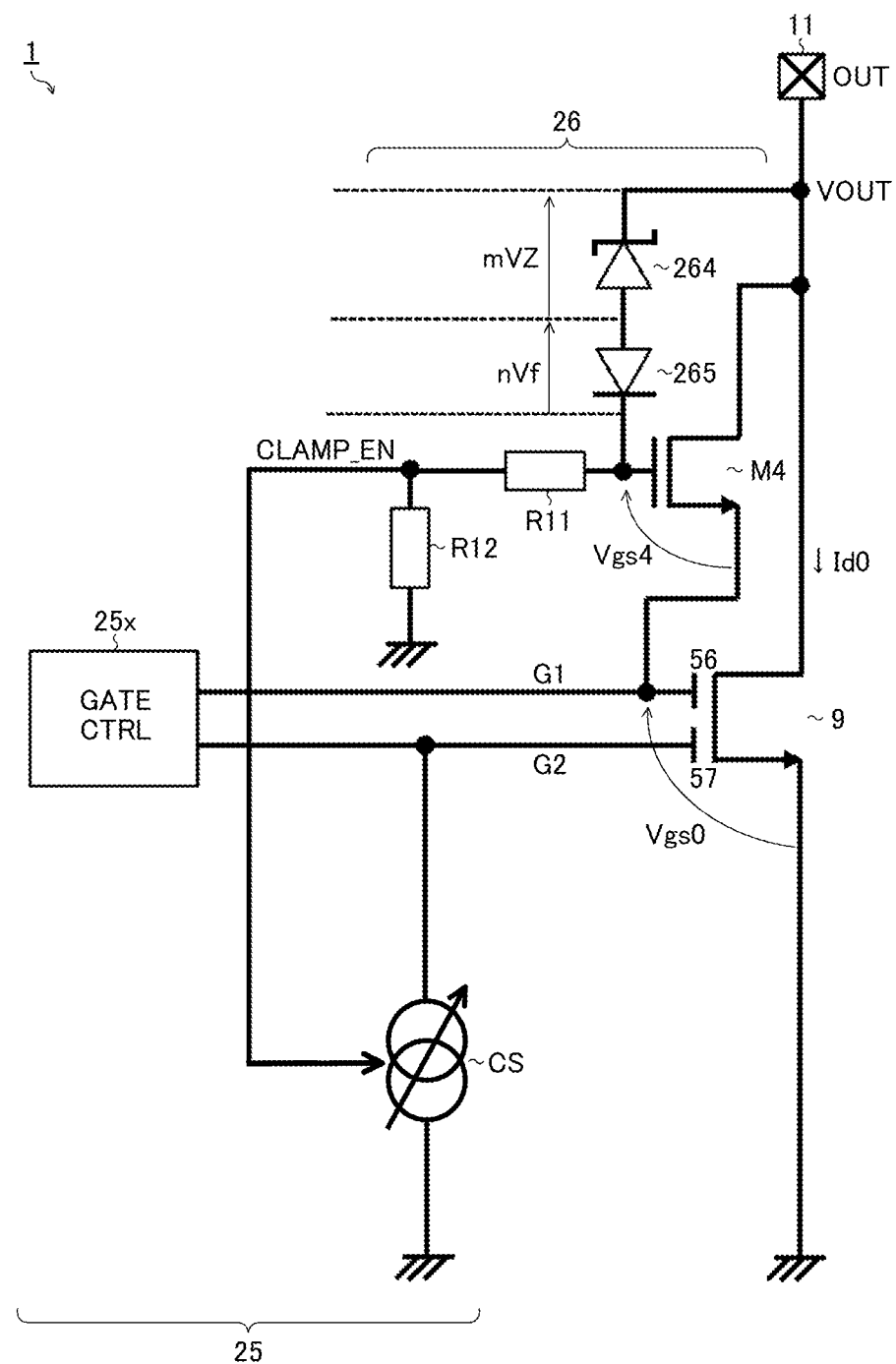
FIG. 17 is a diagram showing a semiconductor device according to a third embodiment.

FIG. 17 is a diagram showing a semiconductor device 1 according to a third embodiment. The semiconductor device 1 according to this embodiment is based on what is shown in FIG. 13, and includes, as a component of the gate control circuit 25, a current source CS in place of the transistor M3.

The current source CS is connected between the gate and the source of the second MISFET 57, and is turned on and off according to the clamp enable signal CLAMP_EN (i.e., the internal node voltage in the active clamp circuit 26). For example, the current source CS turns on when the clamp enable signal CLAMP_EN becomes higher than a predetermined value to draw a constant current from the gate of the second MISFET 57 toward the ground terminal.

With the current source CS described above, unlike the configuration (FIG. 13) where the gate and the source of the second MISFET 57 are simply short-circuited together, also the gate signal G2 (the gate-source voltage Vgs2 of the second MISFET 57) can be lowered gently. Thus, as with the second embodiment described previously (FIG. 15), it is possible to lower the current capacity of the power MISFET 9 gently and thereby suppress an output overshoot.

The gate of the power MISFET 9 may be split into three or more parts. In that case, by raising the ON resistance of the power MISFET 9 stepwise as the drain current Id decreases, it is possible to suppress an output overshoot.

<Application to Vehicles>

Figure 18:
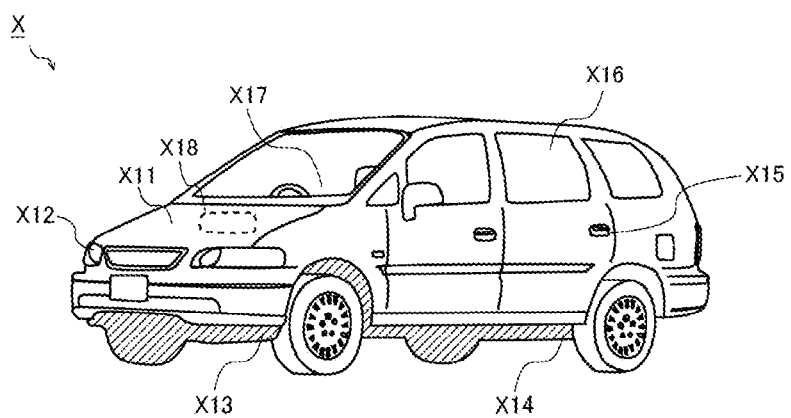
FIG. 18 is an exterior view showing one configuration example of a vehicle.

FIG. 18 is an external appearance view showing one configuration example of a vehicle. The vehicle X of this configuration example incorporates a battery (not shown in the diagram) and various electronic devices X11 to X18 that operate by being supplied with a supply voltage from the battery. For the sake of convenience, in the diagram, the electronic devices X11 to X18 may be shown at places different from where they are actually arranged.

The electronic device X11 is an engine control unit that performs control with respect to an engine (injection control, electronic throttle control, idling control, oxygen sensor heater control, automatic cruise control, etc.).

The electronic device X12 is a lamp control unit that controls the lighting and extinguishing of HIDs (high-intensity discharged lamps), DRLs (daytime running lamps), or the like.

The electronic device X13 is a transmission control unit that performs control with respect to a transmission.

The electronic device X14 is a body control unit that performs control with respect to the movement of the vehicle X (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The semiconductor device 1 described previously can be incorporated in any of the electronic devices X11 to X18.

Overview

To follow is an overview of the various embodiments described above.

For example, according to one aspect of what is disclosed herein, a semiconductor device includes: a split-gate transistor connected between an output electrode and a ground electrode, the split-gate transistor having a plurality of individually controllable channel regions; an active clamp circuit configured to limit the output voltage appearing at the output electrode to a clamp voltage or below; and a gate control circuit configured to raise the ON resistance of the split-gate transistor gently or stepwise after the split-gate transistor is switched from the ON state to the OFF state before the active clamp circuit limits the output voltage. (A first configuration.)

In the semiconductor device of the first configuration described above, the split-gate transistor may include a first transistor and a second transistor configured to be connected in parallel between the output electrode and the ground electrode. The gate control circuit may control the gates of the first and second transistors respectively so as to keep the first and second transistors on in the ON state and keep the first and second transistors off in the OFF state. (A second configuration.)

In the semiconductor device of the second configuration described above, the gate control circuit may decrease the gate-source voltage of the second transistor gently after the split-gate transistor is switched from the ON state to the OFF state before the active clamp circuit limits the output voltage. (A third configuration.)

In the semiconductor device of the third configuration described above, the gate control circuit may include: a third transistor connected between the gate and the source of the second transistor and configured to be turned on and off according to an internal node voltage in the active clamp circuit; and a capacitor connected between the gate and the source of the third transistor. (A fourth configuration.)

In the semiconductor device of the third configuration described above, the gate control circuit may include a current source connected between the gate and the source of the second transistor and configured to be turned on and off according to an internal node voltage in the active clamp circuit. (A fifth configuration.)

In the semiconductor device of the fourth or fifth configuration described above, the active clamp circuit may include: a Zener diode configured to have a cathode connected to the drain of the first transistor; and a diode configured to have an anode connected to the anode of the Zener diode and have a cathode connected the gate of the first transistor or to the gate of a fourth transistor connected between the gate and the drain of the first transistor. (A sixth configuration.)

In the semiconductor device of the sixth configuration described above, the internal node voltage may be the cathode voltage of the diode or a division voltage of it. (A seventh configuration.)

For example, according to another aspect of what is disclosed herein, an electronic device includes: the semiconductor device of any of the first to seventh configurations described above; and a load connected to the semiconductor device. (An eighth configuration.)

In the electronic device of the eighth configuration described above, the load may be an inductive load. (A ninth configuration.)

For example, according to yet another aspect of what is disclosed herein, a vehicle includes the electronic device of the eighth or ninth configuration described above. (A tenth configuration.)

Other Modifications

While the above embodiments deal with, as an example, vehicle-onboard low-side switch ICs, this is not meant to limit the application of the invention disclosed herein, which finds wide application in semiconductor devices in general that include a power transistor, such as vehicle-onboard IPDs (intelligent power devices) for any other uses (like vehicle-onboard low-side switch ICs and vehicle-onboard power supply ICS).

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope and sense equivalent to those claims.

REFERENCE SIGNS LIST 1 semiconductor device
2 semiconductor layer
3 first main surface
4 second main surface
5A to 5D side surface
6 output region
7 input region
8 region separation structure
9 power MISFET
11 drain electrode
12 source electrode
13 input electrode
17 gate control wiring
17A first gate control wiring
17B second gate control wiring
17C third gate control wiring
23 voltage control circuit
24 protection circuit
25 gate control circuit
25x gate driver
26 active clamp circuit
264 Zener diode array
265 diode array
30 driving voltage generation circuit
31 voltage generation circuit
32 voltage generation circuit
33 reference current generation circuit
34 current protection circuit
36 overheat protection circuit
38 oscillation circuit
39 charge pump circuit
40 driving signal output circuit
51 semiconductor substrate
52 epitaxial layer
53 drain region
54 drift region
55 body region
56 first MISFET
57 second MISFET
58 first FET structure
60 first trench gate structure
61 first side wall
62 second side wall
63 bottom wall
68 second FET structure
70 second trench gate structure
71 first side wall
72 second side wall
73 bottom wall
74 cell region
81 first gate trench
82 first insulation layer
83 first electrode
84 first bottom-side insulation layer
85 first opening-side insulation layer
86 first bottom-side electrode
87 first opening-side electrode
88 first intermediate insulation layer
91 first channel region
92 first source region
93 first contact region
101 second gate trench
102 second insulation layer
103 second electrode
104 second bottom-side insulation layer
105 second opening-side insulation layer
106 second bottom-side electrode
107 second opening-side electrode
108 second intermediate insulation layer
111 second channel region
112 second source region
113 second contact region
120 trench contact structure
121 first side wall
122 second side wall
123 bottom wall
131 contact trench
132 contact insulation layer
132A insulation layer
133 contact electrode
133A electrode
139 third cap insulation layer
C capacitor
CS current source
DZ Zener diode
L inductive load
M1 to M4 transistors
OUT output electrode
R, R1H, R1L, K2H, R2L, R3, R11, R12
SW1 to SW3 switch
X vehicle
X11 to X18 electronic devices

The invention claimed is:

1. A semiconductor device, comprising:
a split-gate transistor connected between an output electrode and a ground electrode, the split-gate transistor having a plurality of individually controllable channel regions;
an active clamp circuit configured to limit an output voltage appearing at the output electrode to a clamp voltage or below; and
a gate control circuit configured to raise an ON resistance of the split-gate transistor gently or stepwise after the split-gate transistor is switched from an ON state to an OFF state before the active clamp circuit limits the output voltage.

2. The semiconductor device according to claim 1, wherein
the split-gate transistor includes a first transistor and a second transistor configured to be connected in parallel between the output electrode and the ground electrode, and
the gate control circuit controls gates of the first and second transistors respectively so as to keep the first and second transistors on in the ON state and keep the first and second transistors off in the OFF state.

3. The semiconductor device according to claim 2, wherein
the gate control circuit decreases a gate-source voltage of the second transistor gently after the split-gate transistor is switched from the ON state to the OFF state before the active clamp circuit limits the output voltage.

4. The semiconductor device according to claim 3, wherein
the gate control circuit includes:
a third transistor connected between the gate and a source of the second transistor and configured to be turned on and off according to an internal node voltage in the active clamp circuit; and
a capacitor connected between a gate and a source of the third transistor.

5. The semiconductor device according to claim 3, wherein
the gate control circuit includes a current source connected between the gate and a source of the second transistor and configured to be turned on and off according to an internal node voltage in the active clamp circuit.

6. The semiconductor device according to claim 4, wherein
the active clamp circuit includes:
a Zener diode configured to have a cathode connected to a drain of the first transistor; and
a diode configured to have
an anode connected to an anode of the Zener diode and
a cathode connected the gate of the first transistor or to a gate of a fourth transistor connected between the gate and the drain of the first transistor.

7. The semiconductor device according to claim 6, wherein
the internal node voltage is a cathode voltage of the diode or a division voltage thereof.

8. An electronic device, comprising:
the semiconductor device according to claim 1; and
a load connected to the semiconductor device.

9. The electronic device according to claim 8, wherein the load is an inductive load.

10. A vehicle comprising the electronic device according to claim 8.

* * * * *